US009686871B2

(12) United States Patent
Taniguro et al.

(10) Patent No.: US 9,686,871 B2
(45) Date of Patent: Jun. 20, 2017

(54) SOLDERING DEVICE, SOLDERING METHOD, AND SUBSTRATE AND ELECTRONIC COMPONENT PRODUCED BY THE SOLDERING DEVICE OR THE SOLDERING METHOD

(71) Applicant: TANIGUROGUMI CORPORATION, Nasushiobara-shi, Tochigi (JP)

(72) Inventors: Katsumori Taniguro, Nasushiobara (JP); Genzo Watanabe, Utsunomiya (JP)

(73) Assignee: TANIGUROGUMI CORPORATION, Nasushiobara-shi, Tochigi (JP)

( * ) Notice: Subject to any disclaimer, the term of this patent is extended or adjusted under 35 U.S.C. 154(b) by 121 days.

(21) Appl. No.: 14/777,196

(22) PCT Filed: Mar. 20, 2014

(86) PCT No.: PCT/JP2014/057899
§ 371 (c)(1),
(2) Date: Sep. 15, 2015

(87) PCT Pub. No.: WO2014/148634
PCT Pub. Date: Sep. 25, 2014

(65) Prior Publication Data
US 2016/0044795 A1 Feb. 11, 2016

(30) Foreign Application Priority Data
Mar. 21, 2013 (JP) .................................. 2013-057646

(51) Int. Cl.
*H05K 3/34* (2006.01)
*B23K 1/00* (2006.01)
(Continued)

(52) U.S. Cl.
CPC ............. *H05K 3/34* (2013.01); *B23K 1/0016* (2013.01); *B23K 1/018* (2013.01); *B23K 1/08* (2013.01);
(Continued)

(58) Field of Classification Search
CPC ........................................................ H05K 3/34
See application file for complete search history.

(56) References Cited

U.S. PATENT DOCUMENTS 6,220,501 B1 4/2001 Tadauchi et al.
2002/0130164 A1 9/2002 Matsuki et al.
(Continued)

FOREIGN PATENT DOCUMENTS

DE 8520254 U1 12/1985
EP 2 835 204 A1 2/2015
(Continued)

OTHER PUBLICATIONS

Extended European Search Report from EP 14768053 dated Jan. 9, 2017.

*Primary Examiner* — Lisha Jiang
(74) *Attorney, Agent, or Firm* — Drinker Biddle & Reath LLP

(57) ABSTRACT

A soldering device comprising: a first treatment part that sets a component having an electrode; a second treatment part separated by an opening-closing unit, the second treatment part sending the component on to a third treatment part; the third treatment part separated by an opening-closing unit, the third treatment part causing the component to contact an organic fatty-acid-containing solution and move horizontally; a fourth treatment part having a unit for moving the component to a space portion and causing molten solder to adhere to the electrode; and a unit for removing excess molten solder; a fifth treatment part for horizontally moving
(Continued)

the component moved downward by the fourth treatment part; a sixth treatment part separated by an opening-closing unit, the sixth treatment part sending the component on to a seventh treatment part; and the seventh treatment part separated by an opening-closing unit, the seventh treatment part taking out the component.

5 Claims, 16 Drawing Sheets

(51) Int. Cl.
    *H05K 3/26*     (2006.01)
    *B23K 1/20*     (2006.01)
    *B23K 3/06*     (2006.01)
    *B23K 3/08*     (2006.01)
    *B23K 31/02*     (2006.01)
    *B23K 37/04*     (2006.01)
    *B23K 1/018*     (2006.01)
    *B23K 1/08*     (2006.01)
    *B23K 35/26*     (2006.01)
    *B23K 101/40*     (2006.01)
    *B23K 101/42*     (2006.01)

(52) U.S. Cl.
    CPC .............. *B23K 1/203* (2013.01); *B23K 1/206* (2013.01); *B23K 3/0607* (2013.01); *B23K 3/082* (2013.01); *B23K 3/087* (2013.01); *B23K 31/02* (2013.01); *B23K 37/04* (2013.01); *H05K 3/26* (2013.01); *H05K 3/3463* (2013.01); *H05K 3/3468* (2013.01); *H05K 3/3489* (2013.01); *B23K 35/262* (2013.01); *B23K 2201/40* (2013.01); *B23K 2201/42* (2013.01); *H05K 2203/04* (2013.01); *H05K 2203/0445* (2013.01); *H05K 2203/075* (2013.01); *H05K 2203/0783* (2013.01); *H05K 2203/159* (2013.01); *H05K 2203/1509* (2013.01); *H05K 2203/1518* (2013.01); *H05K 2203/1572* (2013.01)

(56) References Cited

U.S. PATENT DOCUMENTS

| | | | |
|---|---|---|---|
| 2008/0213155 A1* | 9/2008 | Kienzle | ................ C04B 35/573 423/345 |
| 2013/0269984 A1 | 10/2013 | Taniguro | |
| 2014/0036427 A1 | 2/2014 | Taniguro et al. | |
| 2014/0212678 A1 | 7/2014 | Taniguro | |

FOREIGN PATENT DOCUMENTS

| | | |
|---|---|---|
| JP | 7-94853 A | 4/1995 |
| JP | 10-286936 A | 10/1998 |
| JP | H11-114667 A | 4/1999 |
| JP | 2004-11607 A | 4/2004 |
| JP | 2009-260191 A | 11/2009 |
| JP | 2011-040696 A | 2/2011 |
| JP | 2011-054892 A | 3/2011 |
| JP | 4665071 B1 | 4/2011 |
| JP | 2011-114334 A | 6/2011 |
| JP | 2011-211137 A | 10/2011 |
| JP | 2011-233879 A | 11/2011 |
| JP | 5079169 B1 | 11/2012 |
| JP | 5079170 B1 | 11/2012 |
| JP | 5129898 B1 | 1/2013 |
| WO | WO-2011/018861 A1 | 2/2011 |

* cited by examiner

Solder Sn·3Ag·0.5Cu

Solder Sn·3Ag·0.5Cu
·0.05Ni·0.005Ge (A)

(B)

(A)

(B)

SOLDERING DEVICE, SOLDERING METHOD, AND SUBSTRATE AND ELECTRONIC COMPONENT PRODUCED BY THE SOLDERING DEVICE OR THE SOLDERING METHOD

FIELD OF THE INVENTION

The present invention relates to a soldering device and a soldering method, and a substrate and an electrical component produced by such device or method. More particularly, the present invention relates to a soldering device and a method thereof, in which highly reliable soldering can be performed at low cost and with a high yield, and to a substrate and an electrical component produced by such device or method.

BACKGROUND ART

In recent times, wiring density and mounting density in substrates such as printed circuit boards, wafers, flexible substrates and the like (which hereinafter may also be referred to as "mounting substrates") have become increasingly improved. A mounting substrate has a number of electrodes for soldering electrical components thereto. On such electrodes, solder for soldering electrical components, such as solder bumps, solder paste or the like (hereinafter, such solder may also be referred to as "connecting solder"), is provided. Thereafter, the electrical components are soldered to the connecting solder and mounted onto the mounting substrate.

Connecting solder needs to be microscopic and uniform in terms of the shape and dimensions, etc. thereof, and also to be provided only at required parts. As a method for forming connecting solder that satisfies such requirements, Patent Document 1 proposes an approach, or the like, in which paste bumps having a precise and constant shape are easily formed by making use of a screen plate which is provided with openings for forming paste bumps with paste and which is characterized by being consisting of a rigid first metal layer, a resin-based adhesive layer and a second metal layer, wherein the diameter of the openings in the adhesive layer and the second metal layer is reduced with respect to that of the openings in the first metal layer.

Incidentally, variations may be present in the dimensions of connecting terminals, such as lead terminals, etc., of electrical components such as a connector, a QFP (Quad Flat Package), an SOP (Small Outline Package), a BGA (Ball Grid Array), an LGA (Land Grid Array), or the like. In order to solder electrical components having connecting terminals with varied dimensions without causing defective soldering, it is necessary to reduce the influence due to the variations in dimensions of the electrical components by increasing the thickness of the "connecting solder" to be provided on a mounting substrate. When small-scale electrical components, such as a CSP (Chip Size Package) or the like, are mixed in the electrical components for mounting on to the mounting substrate, the size of the connecting solder for such small-scale electrical components is very small and microscopic.

As a general method of forming connecting solder, it is known to dip (immerse) a mounting substrate provided with electrodes made of copper or the like (for example, copper electrodes; the same applies hereinafter), as is, into molten solder. When solder makes contact with the copper electrode, a CuSn intermetallic compound is produced by copper and tin contained in the solder combining together. This production of a CuSn intermetallic compound itself is the basis of a solder joint. However, such phenomenon is sometimes also referred to as "electrode erosion," as it occurs in such a manner that the copper electrodes are eroded by the tin contained in the solder. Such electrode erosion decreases reliability by reducing the volume of the copper electrodes for connecting the electrical components thereto and thus, it is likely that the reliability of the mounting substrate will be deteriorated. Consequently, it is necessary to suppress such electrode erosion by shortening the time during which the mounting substrate is dipped into molten solder. Therefore, a method (dipping method) has been discussed in which a preliminary solder layer is formed over the copper electrodes of the mounting substrate and then, the mounting substrate is dipped into molten solder.

PRIOR ART DOCUMENTS

Patent Documents

Patent Document 1: JP10-286936 A
Patent Document 2: JP5079170 B
Patent Document 3: JP5079169 B

SUMMARY OF THE INVENTION

Problems to be Solved by the Invention

Among the above-described methods of forming connecting solder, the method of forming connecting solder that makes use of a screen plate has a disadvantage to the effect that it has poor productivity. The method of forming connecting solder via the dipping method has a problem to the effect that the issue regarding electrode erosion still cannot be solved since there is a large difference in electrode erosion between parts dipped (immersed) at the beginning and parts dipped at the end and thus, a large difference in the reliability of the electrodes occurs among various parts of one and the same substrate.

In order to solve such problems, the present applicant has proposed Patent Documents 2 and 3. The technique described in Patent Document 2 performs, in a continuous manner: immersion treatment into a solution containing organic fatty acid; molten solder adhesion treatment, which is performed while a member to be treated is pulled upward into a space portion; excessive molten solder removal treatment, which is performed while the member to be treated is lowered from the space portion; and re-immersion treatment into the solution containing organic fatty acid. The technique described in Patent Document 3 performs, in a continuous manner: immersion treatment into a first solution containing organic fatty acid; molten solder spraying treatment within a space portion; excessive molten solder removal treatment, which is performed while moving a member to be treated horizontally within the space portion; and immersion treatment into a second solution containing organic fatty acid. According to these techniques, electrode erosion, such as that seen in the traditional dipping treatment, can be significantly suppressed, and also, substrates and electrical components are produced, which do not cause electrode erosion in various mounting processes thereafter. As a result, substrates and electrical components having highly reliable electrodes, which constitute electrical connection parts, can be produced at low cost with a high yield.

The techniques of Patent Documents 2 and 3 proposed by the present applicant are able to achieve the desired goal; however, since substrates and electrical components (hereinafter, "components") are placed in series on conveyance means, such as a belt conveyor or the like, the overall speed is constant, and it is necessary to adjust the period of the treatment length for each treatment part in terms of the respective treatment times. In addition, an inlet and an outlet for the conveyance means, such as a belt conveyor or the like, to go in and go out cannot be completely sealed, and thus, oil odor from the solution containing organic fatty acid may sometimes leak to the outside.

The present invention is an invention that overcomes the existing problems and is also a further improvement on the techniques of Patent Documents 2 and 3. An object thereof is to provide a new space-saving type soldering device and a soldering method, in which highly reliable soldering can be performed at low cost and with a high yield. Another object of the present invention is to provide components (substrates and electrical components) produced by such soldering device or such soldering method.

Means for Solving the Problems (1) A soldering device according to the present invention for achieving the above-described objects includes: a first treatment part in which a component, having an electrode to be soldered, is set; a second treatment part that is separated in a sealable manner by a first opening-closing unit, which is provided between the first treatment part and the second treatment part, and that sends out the component, which is fed from the first treatment part, to the subsequent third treatment part; a third treatment part that is separated in a sealable manner by a second opening-closing unit, which is provided between the second treatment part and the third treatment part, and that causes the component, which is fed from the second treatment part, to make contact with an organic fatty acid-containing solution, and that moves the component horizontally;
a fourth treatment part that has a molten solder adhesion unit that moves the component, which has been moved horizontally by the third treatment part, to an upper space portion and that causes the molten solder to be adhered onto the electrode and a molten solder removal unit that removes excessive molten solder out of the molten solder adhered in the space portion; a fifth treatment part that moves the component horizontally, which has been moved downward in the fourth treatment part; a sixth treatment part that is separated in a sealable manner by a third opening-closing unit, which is provided between the fifth treatment part and the sixth treatment part, and that sends out the component, which is fed from the fifth treatment part, to the subsequent seventh treatment part; and a seventh treatment part that is separated in a sealable manner by a fourth opening-closing unit, which is provided between the sixth treatment part and the seventh treatment part, and that takes out the component, which is fed from the sixth treatment part.

According to the present invention, since the components pass through the treatment parts in a sequential manner, the individual treatment time at the respective treatment parts can be set in an arbitrary manner, and the size of each treatment part can be designed in accordance with such respective treatment time. As a result, miniaturization of the device can be achieved and a low-cost and efficient soldering device can be obtained. Moreover, since the third treatment part, in which the organic fatty acid-containing solution is used for treatment, can be separated in a sealable manner by means of opening-closing units, it is possible to prevent oil odor from the organic fatty acid-containing solution leaking to the outside. Further, since the third treatment part and the fourth treatment part are provided, an electrode erosion prevention layer can be formed with a uniform thickness on the electrode surface, which is cleaned by means of the organic fatty acid-containing solution, while generating as few voids or defects therein as possible. Consequently, solder which is provided on such electrode erosion prevention layer can also be made to generate as few voids or defects therein as possible.

In the soldering device according to the present invention, the first opening-closing unit and the second opening-closing unit are preferably controlled such that the first opening-closing unit and the second opening-closing unit do not open at the same time, and the third opening-closing unit and the fourth opening-closing unit are preferably controlled such that the third opening-closing unit and the fourth opening-closing unit do not open at the same time.

According to the present invention, oil odor from the solution containing organic fatty acid can be even further prevented from being leaked to the outside.

In the soldering device according to the present invention, the component is loaded onto a cassette, wherein a cassette conveying device for moving the cassette between at least the second treatment part and the third treatment part and a cassette conveying device for moving the cassette between at least the fifth treatment part and the sixth treatment part are preferably provided.

According to the present invention, since the cassette loaded with the component can be moved in an arbitrarily set cycle time, miniaturization of the device can be achieved and a low-cost and efficient soldering device can be obtained.

In the soldering device according to the present invention, the molten solder adhesion unit and the molten solder removal unit are preferably performed while moving the component.

According to the present invention, adhesion of molten solder and removal of excessive solder can be performed efficiently in a short time.

In the soldering device according to the present invention, (a1) the solution containing organic fatty acid is preferably a solution containing a palmitic acid, (b1) the molten solder is preferably molten solder treated with the solution containing organic fatty acid, (c1) removal of the excessive molten solder is preferably performed with the solution containing organic fatty acid, (d1) the sixth treatment part preferably includes a unit for draining off the solution containing organic fatty acid adhered to the component, (e1) the space portion is preferably pressurized by means of vapor from the solution containing organic fatty acid, and (f1) the temperature of the space portion and the temperature of the solution containing organic fatty acid are preferably the same, wherein the temperature in the space portion is preferably the same or higher than the temperature of the molten solder to be sprayed in the space portion.

(2) A soldering method according to the present invention for achieving the above-described objects includes: a first treatment process, in which a component having an electrode to be soldered, is set; a second treatment process that is separated in a sealable manner by a first opening-closing unit, which is provided between the first treatment process and the second treatment process, and that sends out the component, which is fed from the first treatment process, to the subsequent third treatment process; a third treatment process that is separated in a sealable manner by a second opening-closing unit, which is provided between the second treatment process and the third treatment process, and that causes the component, which is fed from the second treatment process, to make contact with an organic fatty acid-containing solution, and that moves the component horizontally; a fourth treatment process that has a molten solder adhesion unit that moves the component, which has been moved horizontally in the third treatment process, to an upper space portion and that causes the molten solder to be adhered to the electrode and a molten solder removal unit that removes excessive molten solder out of the molten solder adhered in the space portion; a fifth treatment process that moves the component horizontally, which has been moved downward in the fourth treatment process; a sixth treatment process that is separated in a sealable manner by a third opening-closing unit, which is provided between the fifth treatment process and the sixth treatment process, and that sends out the component, which is fed from the fifth treatment process, to the subsequent seventh treatment process; and a seventh treatment process that is separated in a sealable manner by a fourth opening-closing unit, which is provided between the sixth treatment process and the seventh treatment process, and that takes out the component, which is fed from the sixth treatment process.

In the soldering method according to the present invention, (a2) the solution containing organic fatty acid is preferably a solution containing a palmitic acid, (b2) the molten solder is preferably molten solder treated with the solution containing organic fatty acid, (c2) the liquid for removing the excessive molten solder is preferably the solution containing organic fatty acid, (d2) the sixth treatment process preferably includes a unit for draining off the solution containing organic fatty acid adhered to the surface of the component, (e2) the space portion is preferably pressurized by means of vapor from the solution containing organic fatty acid, and (f2) the temperature of the space portion and the temperature of the solution containing organic fatty acid are preferably the same, wherein the temperature in the space portion is preferably the same or higher than the temperature of the molten solder to be sprayed in the space portion.

(3) A substrate according to the present invention for achieving the above-described objects is a substrate produced by means of the soldering device or the soldering method according to the present invention, wherein an electrode of the substrate is provided, on the surface thereof, with an electrode erosion prevention layer, a solder layer and an organic fatty acid coating layer, in this order.

(4) An electrical component according to the present invention for achieving the above-described objects is an electrical component produced by means of the soldering device or the soldering method according to the present invention, wherein an electrode of the electrical component is provided, on the surface thereof, with an electrode erosion prevention layer, a solder layer and an organic fatty acid coating layer, in this order.

Effect of the Invention

According to the soldering device and the soldering method of the present invention, since the individual treatment time at the respective treatment parts can be set in an arbitrary manner, the size of each treatment part can be designed in accordance with such respective treatment time. As a result, miniaturization of the device can be achieved by way of space saving, and a low-cost and efficient soldering device can be obtained. Moreover, it is possible to prevent oil odor of the organic fatty acid-containing solution from leaking to the outside. Further, since an electrode erosion prevention layer can be formed on the electrode surface, which is cleaned by means of the organic fatty acid-containing solution, erosion of the electrode can be prevented and it is also possible to generate as few voids or defects as possible in the solder provided on such electrode erosion prevention layer. According to such device and method, substrates and electrical components having highly reliable electrodes, which constitute electrical connection parts, can be produced at low cost with a high yield.

According to the substrate and the electrical component of the present invention, since an electrode of the substrate or the electrical component is provided, on the surface thereof, with an electrode erosion prevention layer, a solder layer and an organic fatty acid coating layer, in this order, even when heat is applied subsequently in a reflow furnace, a firing path or the like, electrode erosion of the electrode is blocked by means of an electrode erosion prevention layer. Consequently, since the substrate and the electrical component can be produced without decreasing the reliability of an electrical connection part (electrode part), even for microscopic electrodes during the mounting processes of the electrical component, which are performed through various processes, and even with a high yield, it is possible to provide low cost and highly reliable substrate and electrical components.

BRIEF DESCRIPTIONS OF THE DRAWINGS

Figure 8:
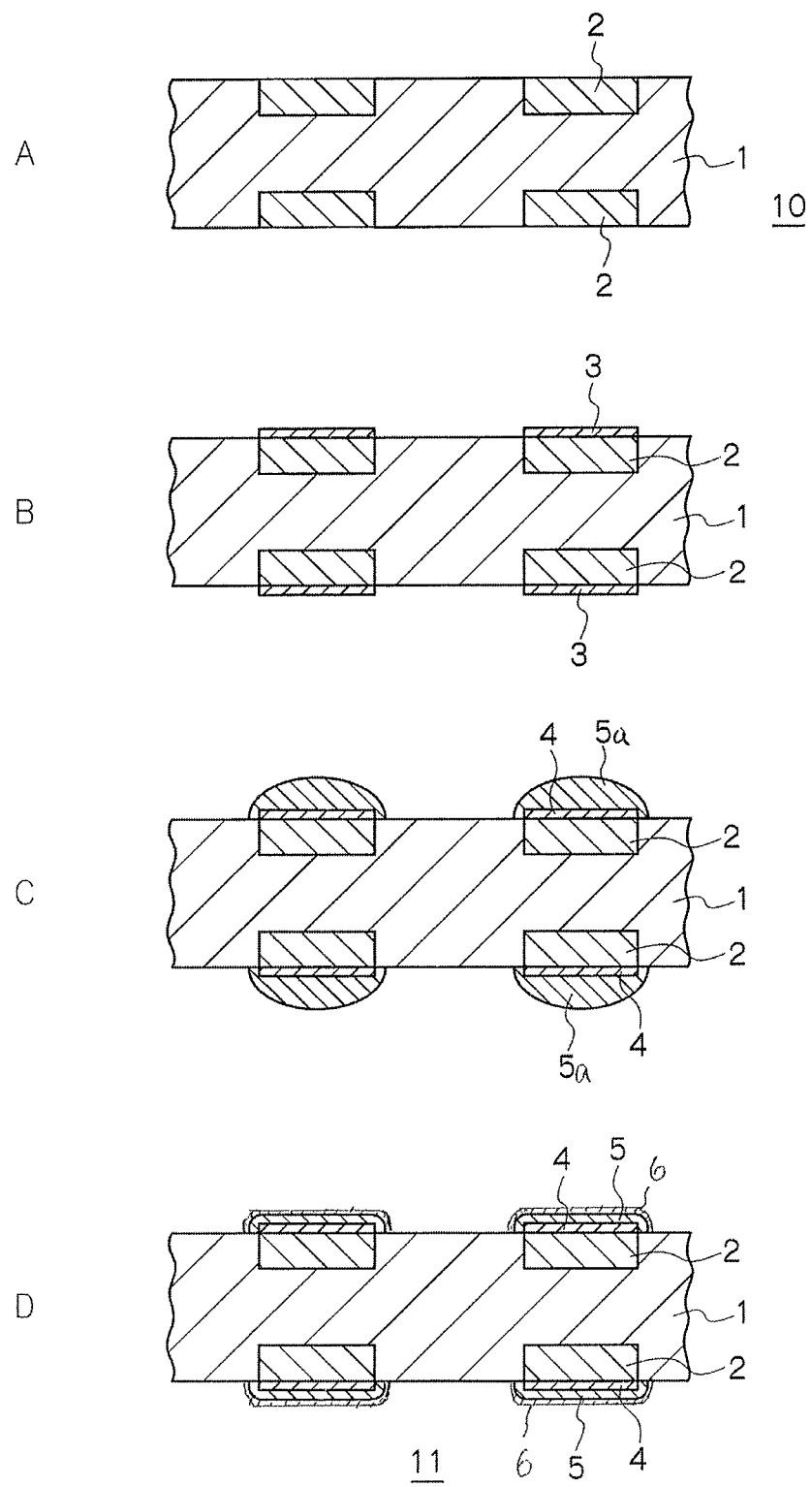

FIG. 8 contains schematic cross-sectional views illustrating forms of a component which has undergone the respective treatment part or process.

Figure 9:
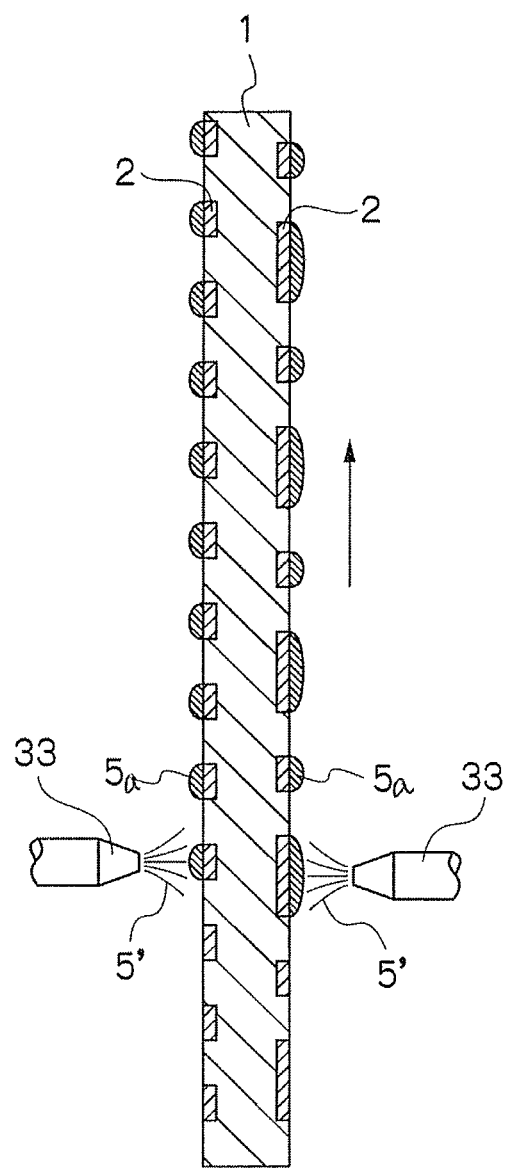

FIG. 9 is a schematic cross-sectional view illustrating a process in which molten solder is sprayed in order to cause the molten solder to be adhered onto electrodes.

Figure 10:
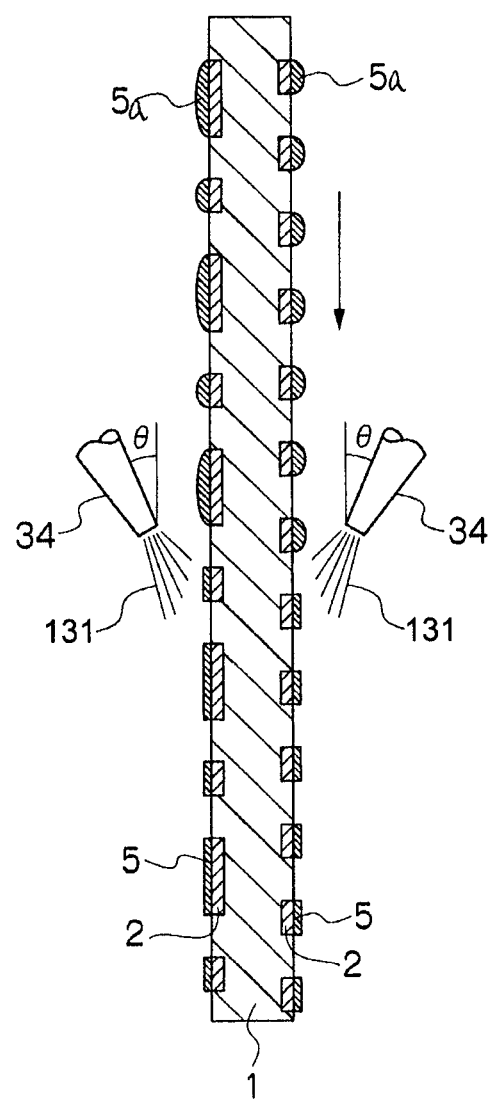

FIG. 10 is a schematic cross-sectional view illustrating a process in which a solution containing organic fatty acid is sprayed in order to remove excessive molten solder.

Figure 11A:
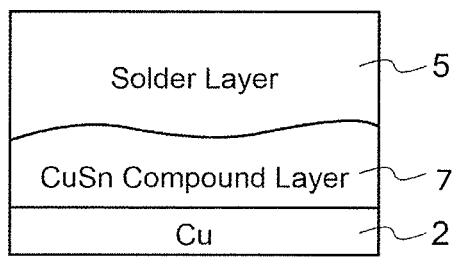
Figure 11B:
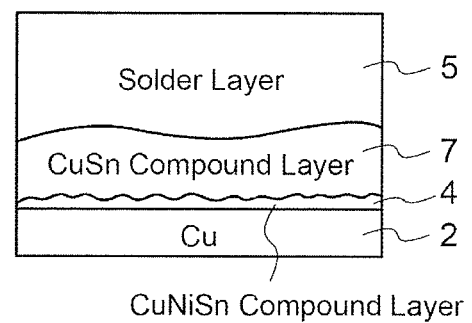

FIG. 11 shows examples of an intermetallic compound layer formed on electrodes, wherein FIG. 11(A) is a schematic cross-sectional view of an electrode part formed with the Comparative Example and FIG. 11(B) is a schematic cross-sectional view of an electrode part formed with the Examples.

Figure 12:
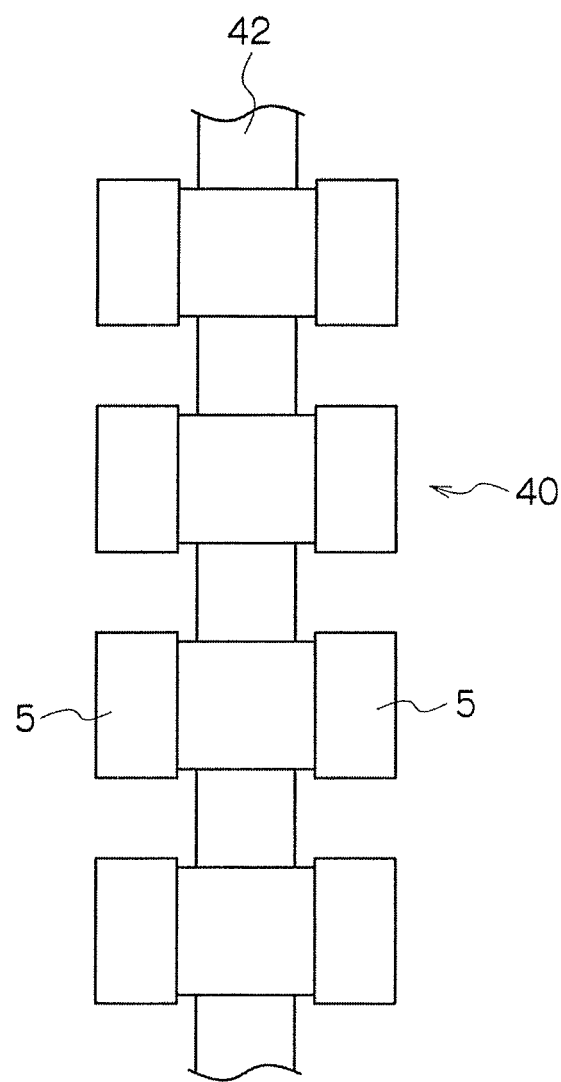

FIG. 12 is a schematic view illustrating an example of an electrical component which is held by a holding jig and treated in a continuous manner.

Figure 13:
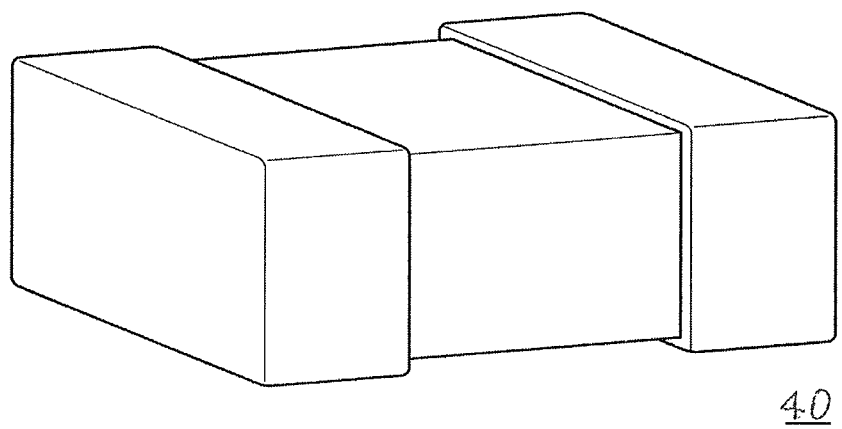
Figure 13:
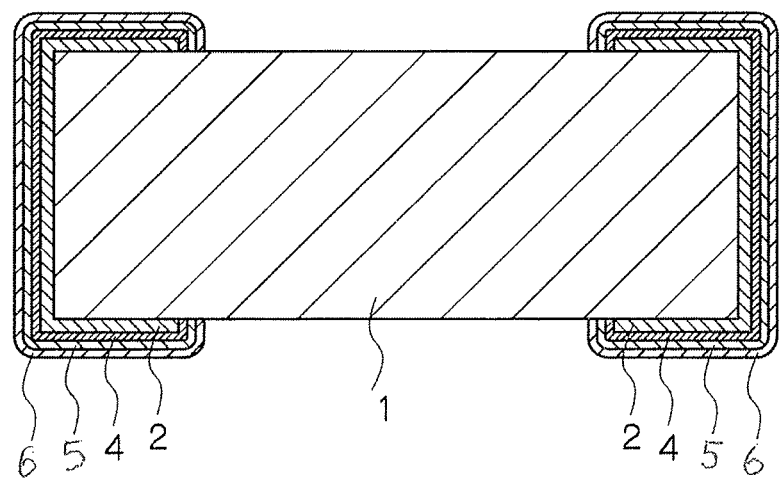

FIG. 13 contains a perspective view and a cross-sectional view illustrating an example of a produced electrical component.

Figure 14:
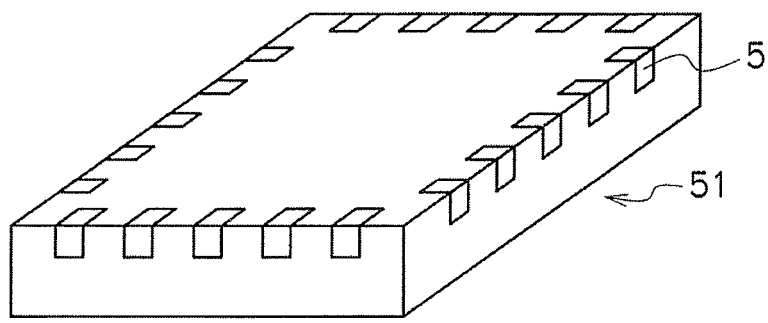
Figure 14:
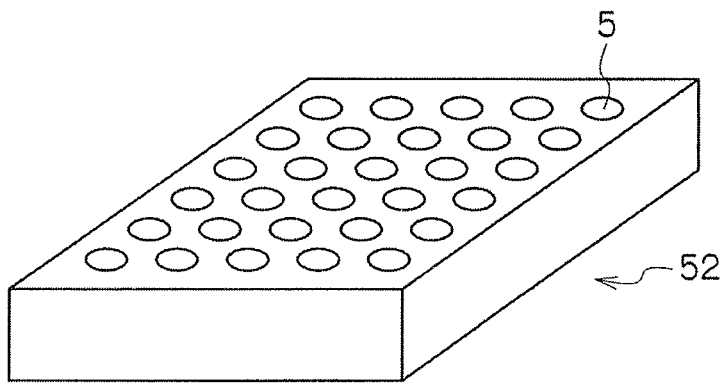

FIG. 14 contains perspective views illustrating another example of a produced electrical component.

Figure 15:
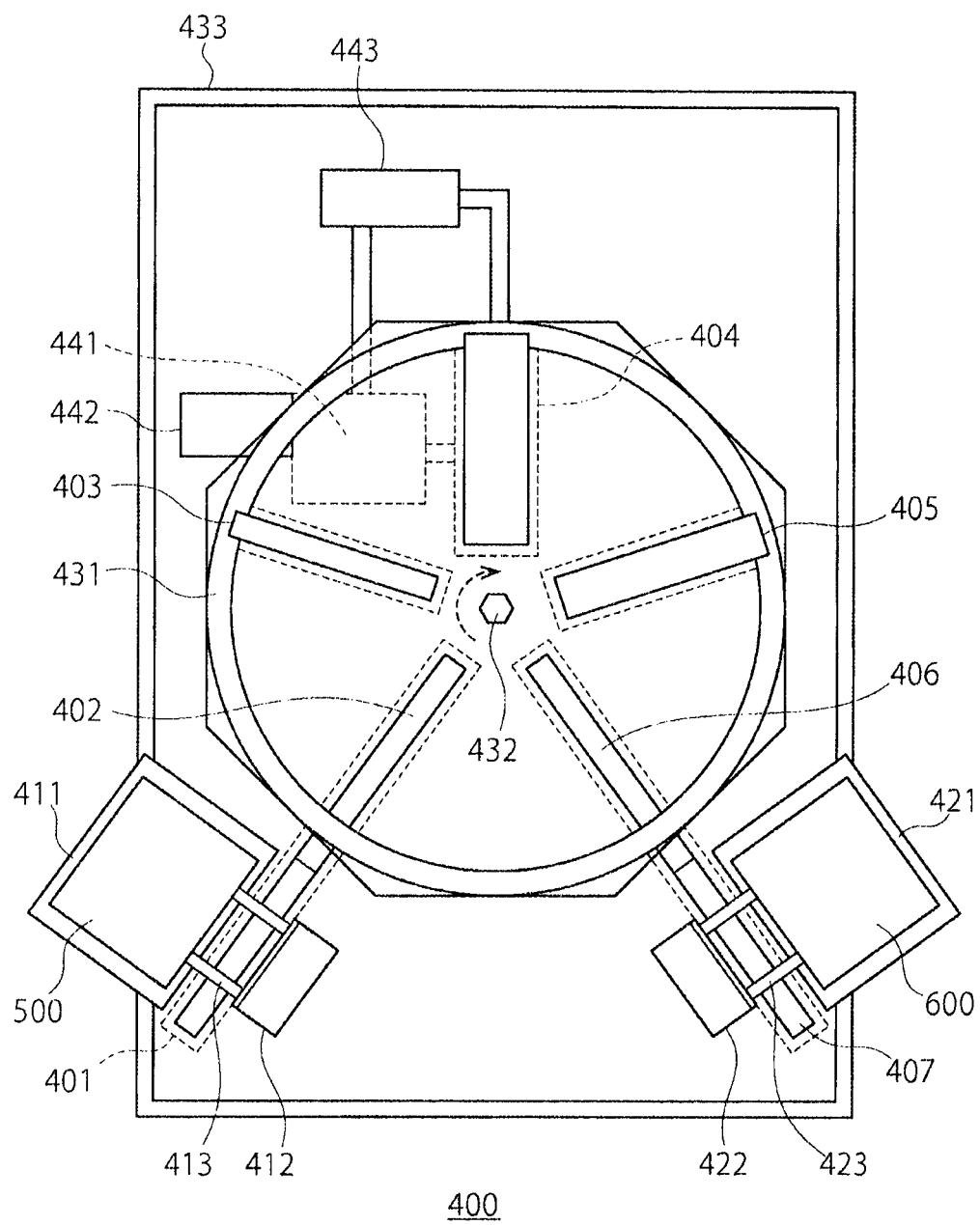

FIG. 15 is a schematic plan view illustrating another example of a soldering device according to the present invention.

Figure 1:
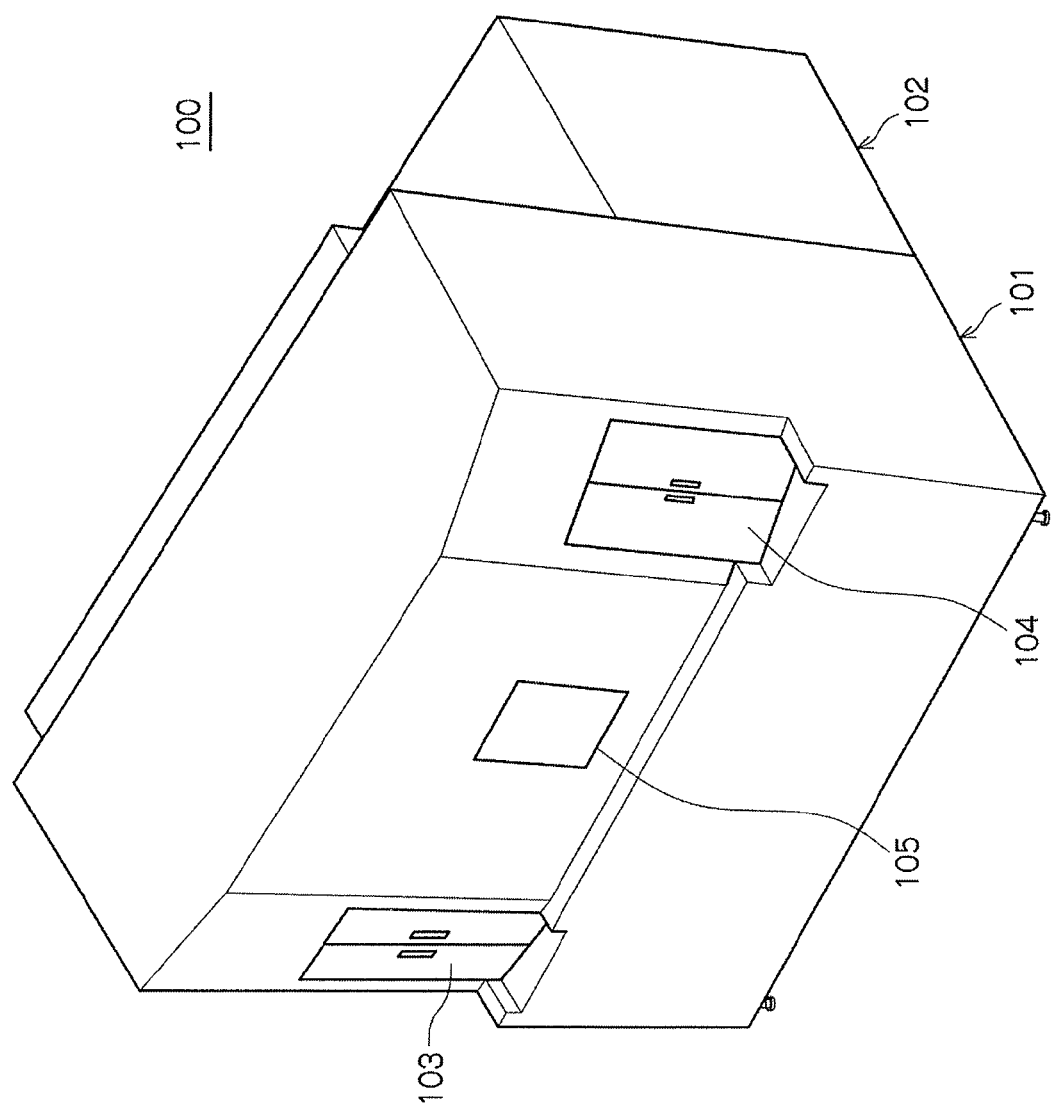
FIG. 1 is a schematic external view illustrating one example of a soldering device according to the present invention.
Figure 16:
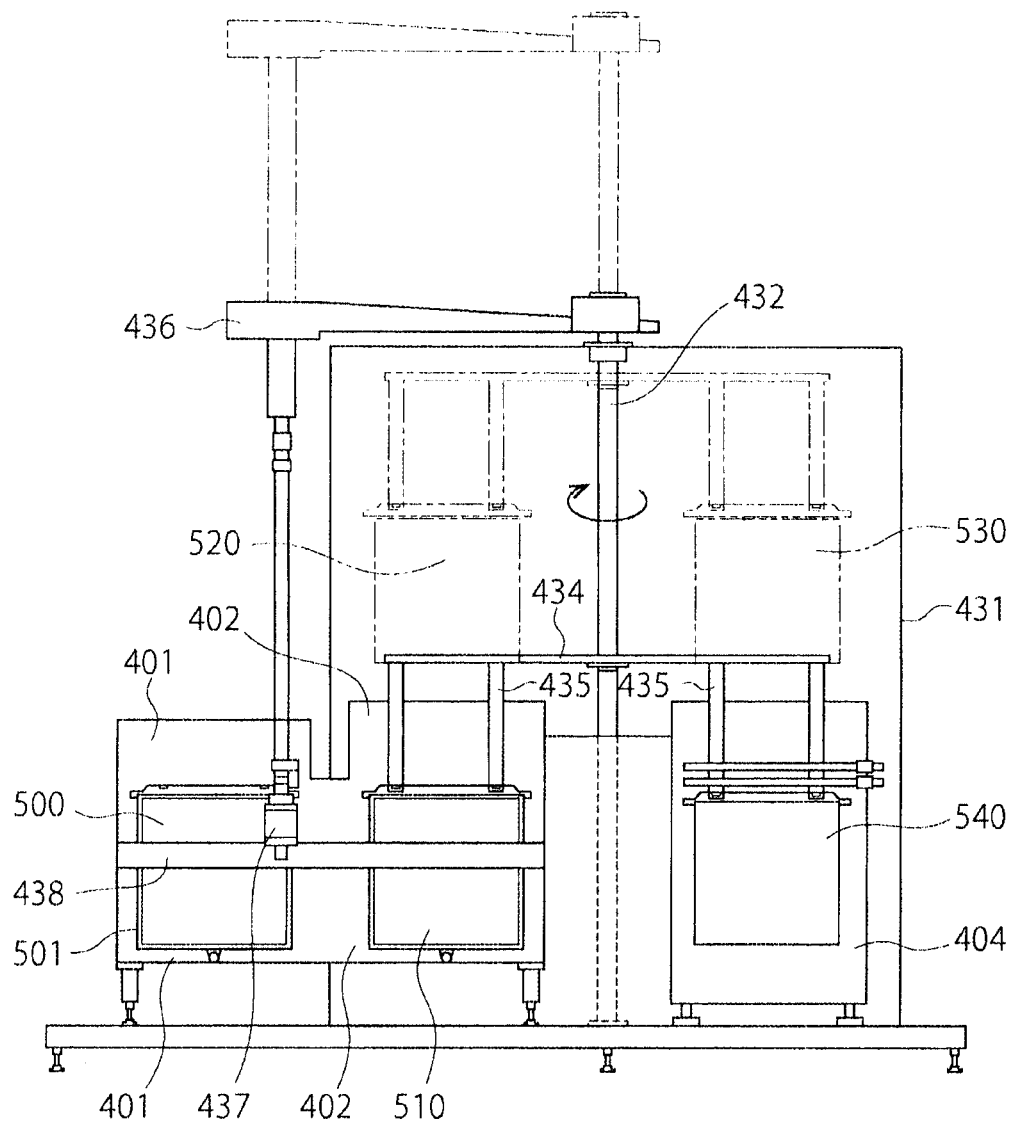

FIG. 16 is a schematic front view of the soldering device shown in FIG. 1.

EMBODIMENTS OF THE INVENTION

Hereinafter, a soldering device and a soldering method according to the present invention, and a substrate and an electrical component produced by such device or method will be described with reference to the drawings. It should be noted that, in the present application, the "present invention" may be rephrased as the "embodiment of the present application." Further, a "treatment part" in the soldering device may be rephrased as a "treatment process" in the soldering method. It should also be noted that an "electrode erosion prevention layer" refers to a layer that functions so as to prevent an electrode configuring an electrode part from being eroded (for example, in the case of a copper electrode, the condition in which copper atoms are diffused and eluted) by the solder.

[Soldering Device and Method]

Figure 2:
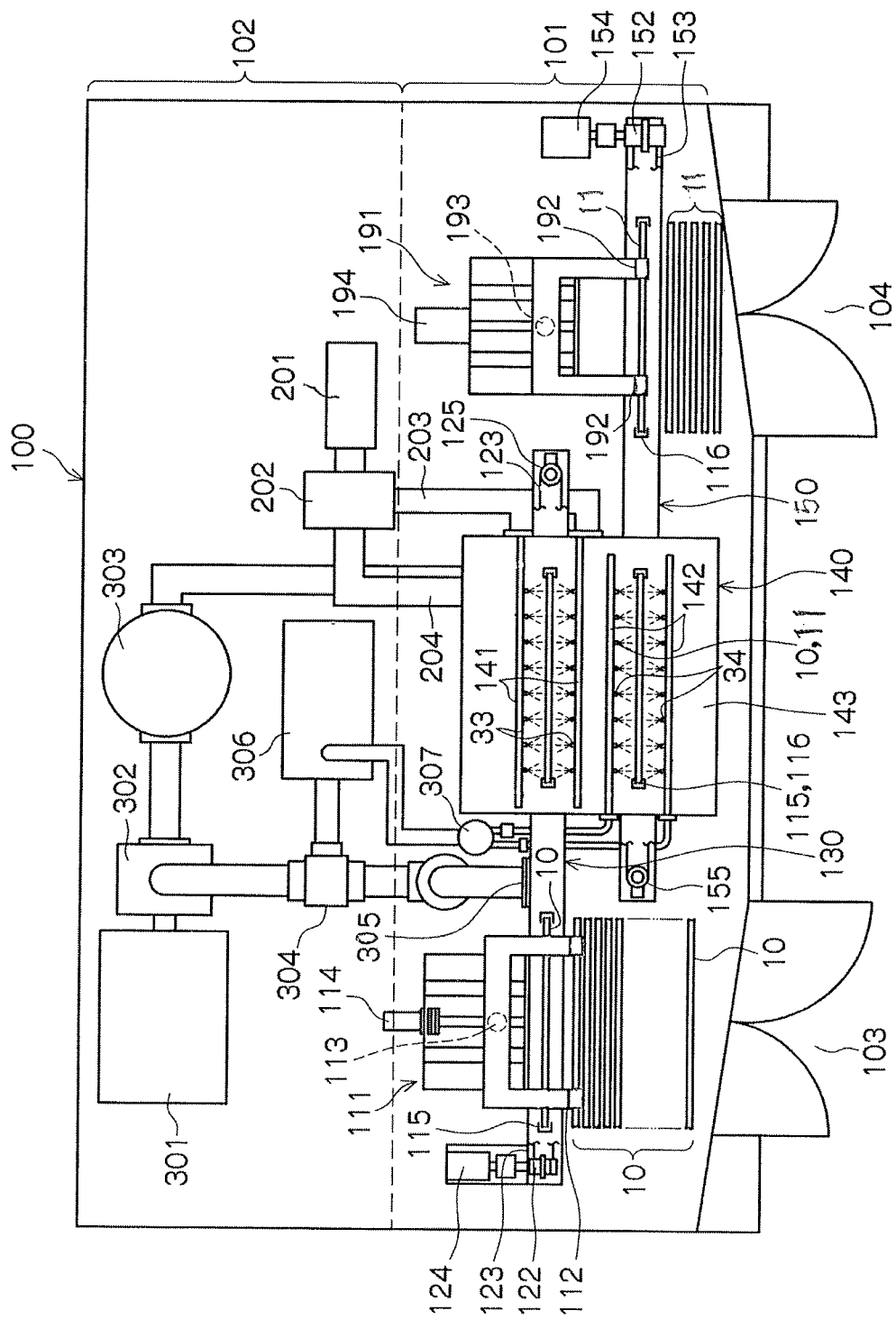
FIG. 2 is a schematic configuration diagram of the soldering device shown in FIG. 1, when seen from the top.
Figure 3:
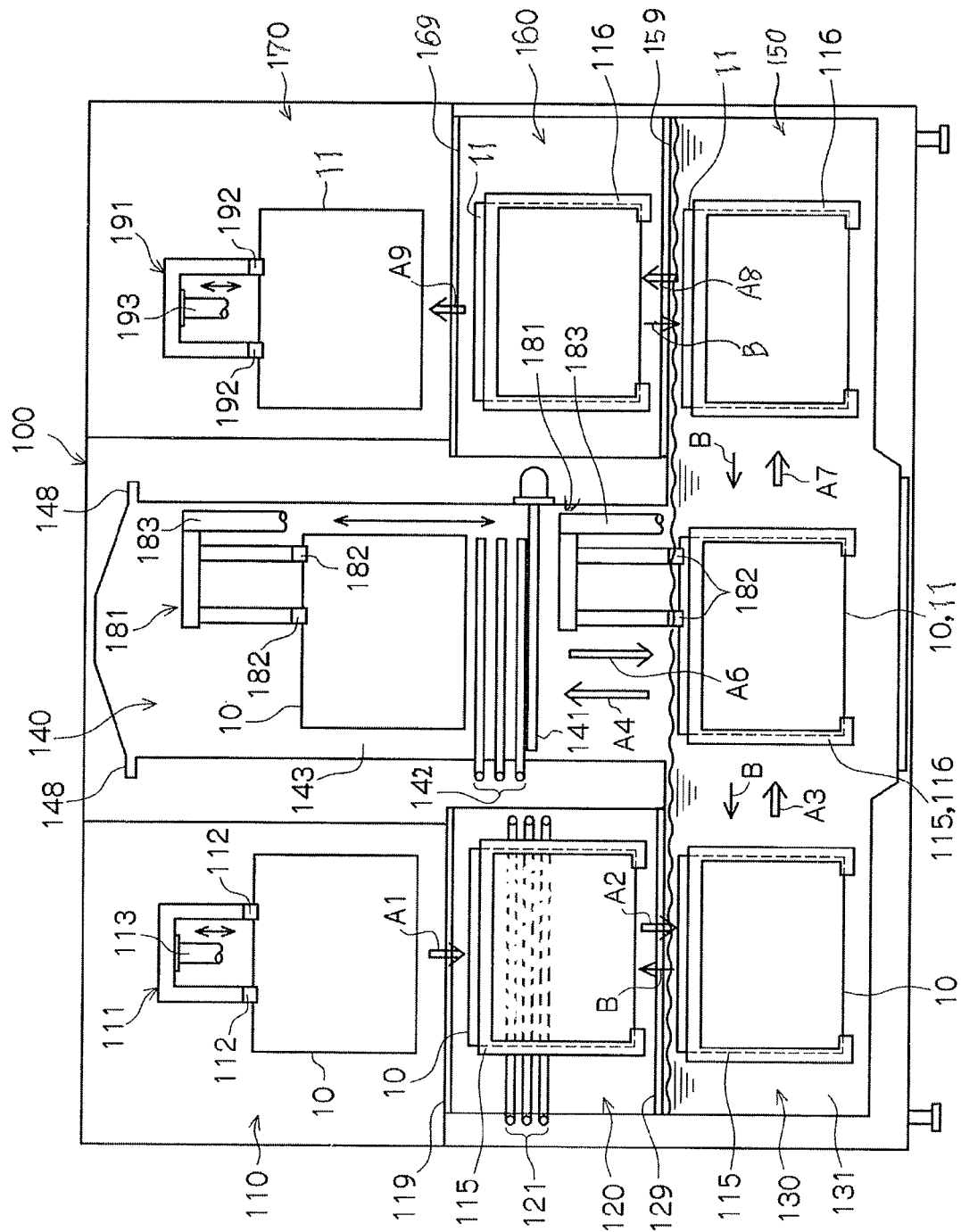
FIG. 3 is a schematic configuration diagram of the soldering device shown in FIG. 1, when seen from the front.

As shown in FIGS. 1 to 3, soldering device 100 and a soldering method according to the present invention are composed of from first treatment part (first treatment process) 110 through seventh treatment part (seventh treatment process) 170.

In particular, soldering device 100 and a soldering method according to the present invention are a soldering device and a method, which include: first treatment part 110 in which component 10 having electrodes 2 to be soldered is set; second treatment part 120 that is separated in a sealable manner by first opening-closing unit 119, which is provided between first treatment part 110 and second treatment part 120, and that sends out component 10, which is fed from first treatment part 110, to the subsequent third treatment part 130; third treatment part 130 that is separated in a sealable manner by second opening-closing unit 129, which is provided between second treatment part 120 and third treatment part 130, and that causes component 10, which is fed from second treatment part 120, to make contact with organic fatty acid-containing solution 131, and that moves component 10 horizontally; fourth treatment part 140 that has molten solder adhesion unit 33 that moves component 10, which has been moved horizontally from third treatment part 130, to upper space portion 143 and that causes molten solder 5a to be adhered to electrodes 2 and molten solder removal unit 34 that removes excessive molten solder 5a out of molten solder 5a adhered in space portion 143; fifth treatment part 150 that moves treated component 11 horizontally, which has been moved downward from fourth treatment part 140; sixth treatment part 160 that is separated in a sealable manner by third opening-closing unit 159, which is provided between fifth treatment part 150 and sixth treatment part 160, and that sends out component 11, which is fed from fifth treatment part 150, to the subsequent seventh treatment part 170; and seventh treatment part 170 that is separated in a sealable manner by fourth opening-closing unit 169, which is provided between sixth treatment part 160 and seventh treatment part 170, and that takes out component 11, which is fed from sixth treatment part 160.

By means of soldering device 100 and the method thereof, it is possible to produce a substrate or an electrical component in which no electrode erosion, such as that seen in the traditional dipping treatment, occurs, and which also does not cause electrode erosion in the subsequent various mounting processes. As a result, substrates and electrical components having highly reliable electrodes, which constitute electrical connection parts, can be produced at low cost with a high yield. In addition, since individual treatment time at the respective treatment parts can be set in an arbitrary manner, the size of each treatment part can be designed in accordance with such respective of treatment time. As a result, miniaturization of the device can be achieved by way of saving space, and a low-cost and efficient soldering device can be obtained. Moreover, leakage of oil odor from the solution containing organic fatty acid to the outside can be prevented.

Soldering device 100 may be an device having an external appearance as illustrated in FIG. 1. In the example of FIG. 1, the soldering device has: treatment part 101, in which from first treatment part 110 to seventh treatment part 170 are arranged; and circulation device part 102, which is provided with a device for circulating molten solder 5a and organic fatty acid-containing solution 131 therein. On the front face side of treatment part 101, carry-in door 103 for carrying in components 10 and take-out door 104 for taking out components 10 are provided, and it also has viewing window 105, which is provided if needed.

Hereinafter, the respective configurations and processes of soldering device 100 will be described in detail.

(First Treatment Part/First Treatment Process)

First treatment part 110 is a treatment part in which component 10, having electrodes 2 to be soldered, is set.

Figure 6:
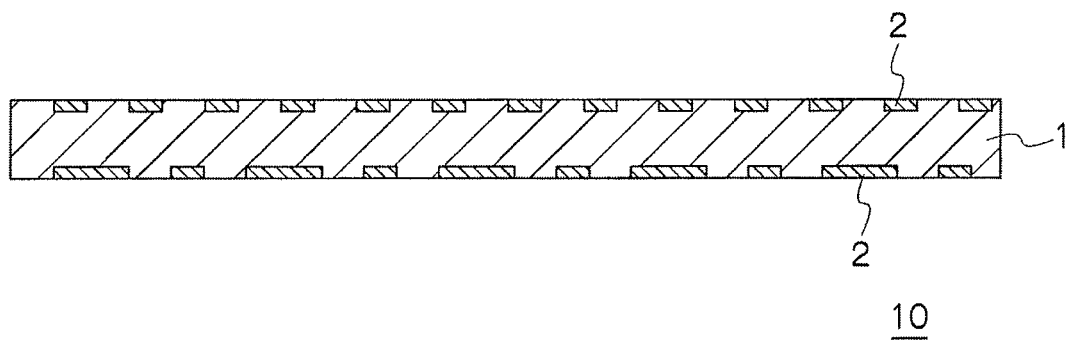
FIG. 6 is a schematic cross-sectional view illustrating an example of a substrate which is a component.

Component 10 is not particularly limited, as long as it is a component in which electrodes 2 are provided in an arbitrary configuration on base material 1. Examples of component 10 include electrical components such as a substrate, such as a printed circuit board, a wafer, a flexible substrate or the like (which may also be referred to as a "mounting substrate"), a connector, a QFP (Quad Flat Package), an SOP (Small Outline Package), a BGA (Ball Grid Array), an LGA (Land Grid Array), a semiconductor chip, a chip resistor, a chip capacitor, jumper wiring material or the like. In addition, examples of component 10 also include publicly known substrate and electrical components other than those illustrated herein and new substrates and electrical components which will be developed in the future. As specific examples of component 10, various types of components such as substrate 10 shown in FIG. 6, electrical component 40 shown in FIGS. 12 and 13(A), and electrical components 51, 52 shown in FIG. 14, are illustrated. Such component 10 has electrodes 2 on one surface or both surfaces thereof.

Electrodes 2 are provided on component 10 in various configurations. The type of electrode 2 is also not particularly limited; however, intended electrodes include conductive electrodes that contain metallic constituents, which will be eroded by being combined with tin contained in molten solder 5a. Examples of metallic constituents that will be eroded by being combined with tin include Cu, Ag, Au, Pd, Rh, Zn, Sn, Ni, Co, Bi or the like. Electrode 2 is formed by one constituent or two or more constituents selected from these metallic constituents. It should be noted that solder wettability and erosion are inextricably associated with one another, wherein "solder wettability" refers to a phenomenon in which one type of, or two or more types of such metallic constituents easily combine with tin contained in molten solder 5a and get wet/expanded as a tin compound, and "erosion" refers to a phenomenon in which one type of, or two or more types of the metallic constituents combine with tin contained in molten solder 5a so as to become a tin compound and thus, electrode 2 becomes thin. Electrode erosion prevention layer 4, which will be described hereinafter, is a layer which prevents such erosion so as to prevent the reliability of electrode 2 from decreasing.

Examples of specific electrode 2 include a copper electrode, a copper alloy electrode, a silver electrode, a silver alloy electrode, a gold electrode, a gold alloy electrode, a palladium electrode, a palladium alloy electrode, an aluminum electrode, an aluminum alloy electrode and the like. When one type of, or two or more types of metallic constituents selected from the above-described Cu, Ag, Au, Pd, Rh, Zn, Sn, Ni, Co, Bi or the like are included in such alloy constituents, such constituents combine with tin contained in molten solder 5a so as to become a tin compound and thus, a phenomenon occurs in which electrode 2 becomes thin.

For example, when electrode 2 is either a copper electrode or a copper alloy electrode, CuSn compound layer 7 is easily formed by the copper constituents of the electrode and tin in the molten solder (see, for example, FIG. 11(A)). As a result, the number of copper constituents constituting electrode 2 is reduced (i.e. electrode erosion) and thus, electrode 2 becomes thin. Similarly, when one type of, or two or more types of metallic constituents selected from Cu, Ag, Au, Pd, Rh, Zn, Sn, Ni, Co, Bi or the like are included as constituents of electrode 2 such as a silver electrode, a silver alloy electrode, a gold electrode, a gold alloy electrode, a palladium electrode, a palladium alloy electrode, an aluminum electrode, an aluminum alloy electrode or the like, an MSn compound is easily formed by such one type of, or two or more types of constituents (M) and tin (Sn) in the molten solder. As a result, the number of constituents M constituting electrode 2 is reduced and thus, electrode 2 becomes thin.

The configuration and dimensions of electrode 2 are not particularly limited; however, in the case of patterns of electrodes provided on a substrate, a narrow pattern or a microscopic circular pattern having, for example, a pattern width or pattern diameter ranging from 5 µm or 10 µm to 500 µm, inclusive, may be illustrated. Further, in the case of electrodes provided on an electrical component, depending on the type of such electrical component, electrodes having dimensions ranging from a few hundred µm to a few mm, inclusive, may be illustrated.

In addition, the thickness of electrode 2 is also not particularly limited; however, as an example, a thickness ranging from, for example, 5 µm to 30 µm, inclusive, may be provided. The size and outer shape of base material 1 onto which electrodes 2 are provided are also not particularly limited, and the present invention may be applied to various types of base materials. The method of producing a component according to the present invention is a method of forming electrode erosion prevention layer 4, which is capable of suppressing elusion of electrode constituents, onto the surface of such electrode 2.

Such components 10 are carried in to soldering device 100 from carry-in door 103 shown in FIG. 1. The carried-in components 10 are arranged, for example, in a sequential manner as shown in FIG. 2, and are sent in a sequential manner into second treatment part 120 by means of grip/hold device (device that grips and holds the components) 111. When electrodes 2 are provided on both surfaces of component 10, one component 10 is sent in to second treatment part 120 at a time; however, when electrodes are provided on only one surface of component 10, two components 10 may be sent in to second treatment part 120 at a time. Grip/hold device 111 is not particularly limited; however, a device may be illustrated, which has a grip part 112 and in which ascending-descending shaft 113 is controlled such that it moves upward or downward by means of ascending-descending motor 114.

It should be noted that when component 10 is a printed circuit board or the like, such printed circuit board having a rectangular shape is set as is; however, when component 10 is, for example, electrical component 40 shown in FIG. 12, it is preferred that electrical component 40, which is attached to holding jig 42 adapted to the shape of electrical component 40, is set.

(Second Treatment Part/Second Treatment Process)

Second treatment part 120 is a treatment part that is separated in a sealable manner by first opening-closing unit 119, which is provided between first treatment part 110 and second treatment part 120, and that sends out component 10, which is fed from first treatment part 110, to the subsequent third treatment part 130.

In second treatment part 120, a shutter (not shown; the same applies hereinafter) of first opening-closing device 119 is closed until component 10 is fed from first treatment part 110. The shutter opens immediately before component 10 is fed in. After the shutter opens, component 10 is conveyed downward from first treatment part 110 and is loaded onto cassette 115. After the loading onto cassette 115, the shutter of first opening-closing device 119 closes and then a shutter of second opening-closing device 129 opens so as to send in cassette 115 loaded with component 10 (hereinafter referred to as "component-loaded cassette 115") to third treatment part 130.

After component-loaded cassette 115 is sent in to third treatment part 130, it is preferred that the shutter of second opening-closing device 129 closes and that the mist or odor of organic fatty acid-containing solution 131 in third treatment part 130, which has entered from second treatment part 120, is changed through purging with air, inert gas or the like. In this way, the mist or odor of organic fatty acid-containing solution 131 used in third treatment part 130 can be prevented from flowing from second treatment part 120 into first treatment part 110 to be leaked to the outside. It should be noted that the mist or odor that is changed through purging may be treated by a deodorizing device or an adsorption device.

Conveyance of cassette 115 is not particularly limited; however, it may be performed, for example, by means of cassette conveying device 122 such as that shown in FIG. 2. Cassette conveying device 122 is composed of conveying wire 123, conveying motor 124 and conveying roller 125. Cassette 115 may, by means of cassette conveying device 122, be reciprocated in a repeated manner between at least second treatment part 120 and third treatment part 130.

The shape of second treatment part 120 is not particularly limited; however, it is sufficient when it is of a large enough size to load one or two components 10 onto one cassette 115. In the example of FIG. 2, second treatment part 120 (not shown) is structured in an elongated configuration, when seen from the top, and is particularly advantageous in terms of saving space.

Second treatment part 120 is preferably provided with heater 121 for pre-heating. By pre-heating components 10 with heater 121, it is possible to suppress a temperature drop of organic fatty acid-containing solution 131 when component 10 makes contact with organic fatty acid-containing solution 131 in third treatment part 130.

(Third Treatment Part/Third Treatment Process)

Third treatment part 130 is a treatment part that is separated in a sealable manner by second opening-closing unit 129, which is provided between second treatment part 120 and third treatment part 130, and that causes component 10, which is fed from second treatment part 120, to make contact with organic fatty acid-containing solution 131, and that moves component 10 horizontally.

Component-loaded cassette 115 is lowered and sent in to third treatment part 130 and component 10 makes contact with organic fatty acid-containing solution 131 in third treatment part 130. As shown in FIG. 3, component 10 is typically immersed into a constant amount of organic fatty acid-containing solution 131 contained in third treatment part 130 and makes contact therewith; however, organic fatty acid-containing solution 131 may be sprayed using a shower. It should be noted that, after component-loaded cassette 115 is sent in to third treatment part 130, the shutter of second opening-closing device 129 closes.

The size and shape of third treatment part 130 are not particularly limited; however, it is preferred that it has a size and shape sufficiently large so as to allow component 10 make contact with organic fatty acid-containing solution 131 and a size and shape which do not impede the conveyance of component-loaded cassette 115. In the example of FIG. 2, third treatment part 130 is structured in an elongated configuration, when seen from the top, and is particularly advantageous in terms of saving space.

Component-loaded cassette 115 that has made contact with organic fatty acid-containing solution 131 is moved horizontally to a location where it is pulled upward for molten solder adhesion treatment or excessive solder removal treatment, which is described hereinafter. Thereafter, component-loaded cassette 115 is lifted to the upper space portion that configures fourth treatment part 140.

The temperature of organic fatty acid-containing solution 131 in third treatment part 130 is determined by the liquid current temperature of molten solder 5a since the vapor evaporated from organic fatty acid-containing solution 131 makes the temperature of space portion 143 configuring fourth treatment part 140 the same or substantially the same as the liquid current temperature of molten solder 5a. For example, when the liquid current temperature of molten solder 5a is approximately 250° C., the temperature of organic fatty acid-containing solution 131 is preferably the same or substantially the same as such temperature. When the liquid current temperature of low-temperature type molten solder 5a is approximately 150° C., the temperature of organic fatty acid-containing solution 131 is preferably the same or substantially the same as such temperature. By setting to such temperature, the temperature of the vapor evaporated from organic fatty acid-containing solution 131 can be made the same or substantially the same as the liquid current temperature of molten solder 5a. As a means for controlling the temperature of organic fatty acid-containing solution 131, a heater or a cooler may be wrapped around third treatment part 130, a heater or a cooling tube may be inserted in a bath, or the temperature of organic fatty acid-containing solution 131 in the bath may be controlled by circulating the solution through a temperature adjustment device (not shown).

Organic fatty acid-containing solution 131 in third treatment part 130 is preferably a solution containing an organic fatty acid having a carbon number of 12 to 20, inclusive. An organic fatty acid having a carbon number of 11 or less is also usable; however, such organic fatty acid has a water-absorbing property and is therefore not preferable. In addition, an organic fatty acid having a carbon number of 21 or more has drawbacks such as a high melting point, poor permeability, difficulty in handling and the like. As a representative, a palmitic acid having a carbon number of 16 is preferred. As an organic fatty acid, it is particularly preferred that only a palmitic acid having a carbon number of 16 is used; however, an organic fatty acid having a carbon number of 12 to 20, inclusive, for example, a stearic acid having a carbon number of 18, may also be included as needed.

For organic fatty acid-containing solution 131, a solution which contains between 5 mass % and 25 mass %, inclusive, of palmitic acid and in which the remainder thereof is ester synthesis oil, is preferably used. By using such organic fatty acid-containing solution 131, such organic fatty acid-containing solution 131 can selectively take in impurities, such as oxides, flux components or the like, which are present on the electrode surface of component 10, and therefore clean the electrode surface. In particular, organic fatty acid-containing solution 131 containing approximately 10 mass % (for example, between 5 mass % and 15 mass %, inclusive) of palmitic acid having a carbon number of 16 is preferred. It should be noted that organic fatty acid-containing solution 131 does not contain metallic salt such as nickel salt, cobalt salt and the like, or an additive such as an autoxidizing agent and the like.

At the organic fatty acid concentration less than 5 mass %, the effect of selectively taking in and purifying the impurities, such as oxides, flux components or the like, present on the surfaces of electrodes 2 is relatively low, and further, control at the low concentration may be cumbersome. On the other hand, when the organic fatty acid concentration exceeds 25 mass %, problems emerge to the effect that the viscosity of organic fatty acid-containing solution 131 becomes high, generation of smoke and bad odor occurs at a high temperature region of 300° C. or more, and the like. Therefore, the content of organic fatty acid is preferably between 5 mass % and 25 mass %, inclusive, and, particularly when only a palmitic acid having a carbon number of 16 is used, the content is preferably approximately 10 mass % (for example, between 5 mass % and 15 mass %, inclusive).

In third treatment part 130, component 10 makes contact with the above-described organic fatty acid-containing solution 131 and, as a result, oxides, impurities or the like present on the surfaces of electrodes 2 of component 10 are removed and cleaned. Then organic fatty acid coating layer 3 (see FIG. 8(B)), which makes up organic fatty acid-containing solution 131, is formed on the surface of electrode 2. Such coating layer 3 cleans the surface of electrode 2 and further prevents the generation of an oxide layer by suppressing oxidization of the surface of electrode 2.

(Fourth Treatment Part/Fourth Treatment Process)

Fourth treatment part 140 is a treatment part that has molten solder adhesion unit 33 that moves component 10, which has been moved horizontally from third treatment part 130, to upper space portion 143 and that causes molten solder 5a to be adhered onto electrodes 2 and molten solder removal unit 34 that removes excessive molten solder 5a out of molten solder 5a adhered in space portion 143. It should be noted that reference number 141 denotes piping for molten solder 5a and that spraying nozzles 33 are typically provided on piping 141 at regular intervals. Reference number 142 denotes piping for organic fatty acid-containing solution 131, and spraying nozzles 142 are typically provided on piping 142 at regular intervals.

As shown in FIG. 3, in fourth treatment part 140, component 10 is gripped out by grip part 182 of grip/hold device 181 from component-loaded cassette 115, and the subsequent ascending, descending, horizontal movement or the like is carried out by way of the ascending or descending of ascending-descending shaft 183. It should be noted that, in the example of FIG. 3, only component 10 is gripped out and moved from component-loaded cassette 115; however, component-loaded cassette 115 may also be moved as is and adhesion unit 33 and removal unit 34 may be applied thereto.

First, molten solder adhesion unit 33 will be described.

Figure 4:
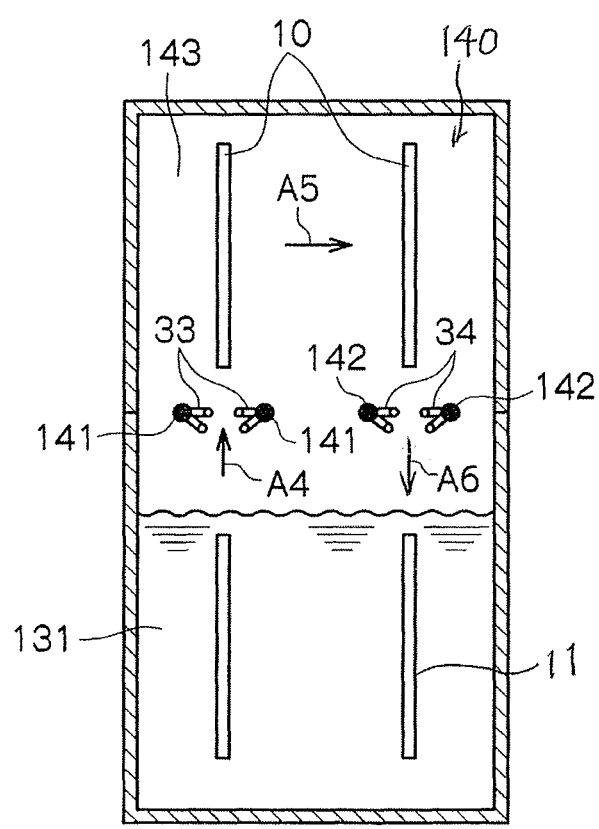
FIG. 4 is a schematic configuration diagram of a fourth treatment part, when the soldering device shown in FIG. 1 is seen from the left hand side.
Figure 5:
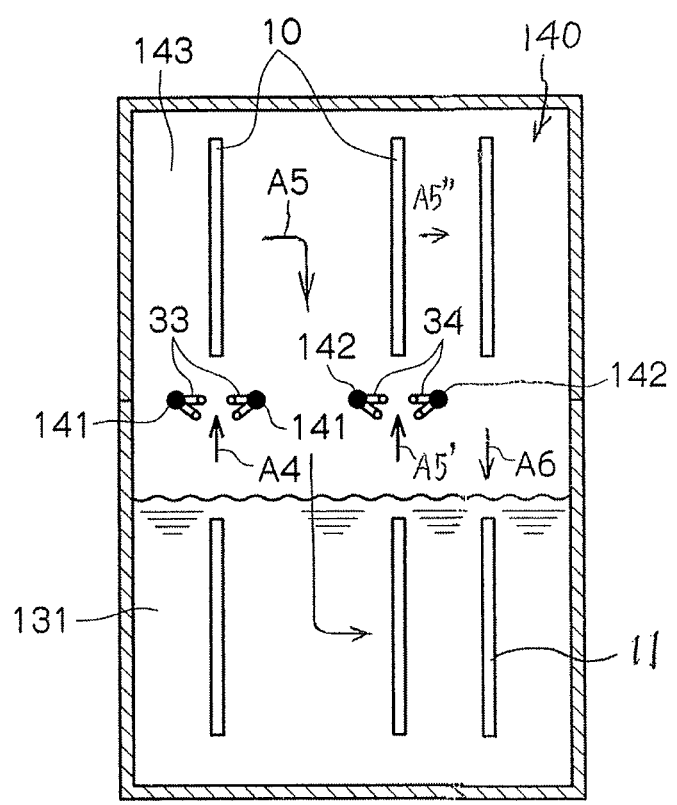
FIG. 5 is a schematic configuration diagram illustrating another example of a fourth treatment part, when the soldering device shown in FIG. 1 is seen from the left hand side.

Molten solder adhesion unit 33 moves component 10, which has been moved horizontally from third treatment part 130, to upper space portion 143 and causes molten solder 5a to be adhered onto electrodes 2. As shown in FIGS. 3 to 5, component 10 is pulled upward to upper space portion 143 after being treated with organic fatty acid-containing solution 131 in third treatment part 130. Space portion 143 is a pressurized space portion having a vapor atmosphere of organic fatty acid-containing solution the same or substantially the same as that of organic fatty acid-containing solution 131, and also in which adhesion unit 33, which sprays liquid current 5' of molten solder 5a toward electrodes 2 provided on component 10, and removal unit 34, which will be described hereinafter, that removes excessive molten solder 5a by spraying organic fatty acid-containing solution 131 onto the same, are arranged so as to be spaced apart from each other in the horizontal direction.

Space Portion

Preferably, space portion 143 is filled with vapor or the like of organic fatty acid-containing solution 131 and is in a pressurized condition. The pressure in space portion 143 is not particularly limited; however, it is preferably approximately 0.1 Pa. In particular, since the pressurized condition in the above-described range is obtained by the vapor of organic fatty acid-containing solution 131, no oxidization or contamination by impurities occurs in electrodes 2 of component 10. Space portion 143 is formed by first introducing nitrogen gas therein and then filling space portion 143 with vapor of organic fatty acid-containing solution 131, which is generated by heating the same. It should be noted that reference numeral 148 denotes a drain for adjusting the pressure inside the space portion or for carrying out a change of gas.

The atmospheric temperature of space portion 143 is preferably the same as or close to the temperature of molten solder 5a for soldering. It may be the same as that of molten solder 5a; however, it is preferably set to a temperature slightly higher than the temperature of molten solder 5a. For example, as compared to the liquid current temperature of molten solder 5a, the atmospheric temperature of space portion 143 is preferably set to a temperature that is higher by between 2° C. and 10° C., inclusive, and the atmospheric temperature is preferably set to an atmospheric temperature between 2° C. and 5° C., inclusive. By making the atmospheric temperature fall within this temperature range, liquid current 5' of molten solder 5a, after being sprayed onto the surface of electrode 2, can flow over the surface of electrode 2 evenly. In particular, molten solder 5a can be spread completely over fine-pitched electrodes or surfaces of small-area electrodes. When atmospheric temperature is lower than the liquid current temperature of molten solder 5a, the viscosity of molten solder 5a decreases and the fluidity of molten solder 5a may be reduced. On the other hand, when the atmospheric temperature is set at a temperature that exceeds the liquid current temperature by 10° C. or more, thermal damage is likely to be caused to component 10 due to high temperature.

Third treatment part 130 is located below space portion 143 and vapor of organic fatty acid-containing solution 131 evaporated from third treatment part 130 fills space portion 143. The amount of the solution is not particularly limited; however, it is sufficient when such amount can generate vapor that causes the pressure in space portion 143 to be approximately 0.1 MPa.

The temperature of organic fatty acid-containing solution 131 below space portion 143 is determined by the liquid current temperature of molten solder 5a since the vapor evaporated therefrom makes the temperature of space portion 143 the same or substantially the same as the liquid current temperature of molten solder 5a. For example, when the liquid current temperature of molten solder 5a is 250° C. or, as in the case of low-temperature molten solder 5a, approximately 150° C., the temperature of organic fatty acid-containing solution 131 is preferably the same or substantially the same as such temperature. By setting to such temperature, the temperature of the vapor evaporated from organic fatty acid-containing solution 131 can be made the same or substantially the same as the liquid current temperature of molten solder 5a. As a means for controlling the temperature of organic fatty acid-containing solution 131, a heater or a cooler may be wrapped around third treatment part 130, a heater or a cooling tube may be inserted in a bath, or the temperature of organic fatty acid-containing solution 131 in the bath may be controlled by circulating the solution through a temperature adjustment device (not shown).

Adhesion Treatment

In space portion 143 configuring fourth treatment part 140, adhesion treatment (which may also be referred to as "spraying treatment") of molten solder 5a toward electrodes 2 of component 10 is performed. More specifically, as shown in FIGS. 3 to 5, while pulling component 10 upward into upper space portion 143 from organic fatty acid-containing solution 131, liquid current 5' of molten solder 5a is sprayed onto component 10 so as to cause molten solder 5a to be adhered onto electrodes 2. The adhesion treatment is performed by adhesion unit 33 that sprays liquid current 5' of molten solder 5a, wherein, for example, as shown in FIGS. 4 and 5, spraying nozzles 33 are preferably used. Spraying nozzles 33 are preferably arranged on the side of the surface on which electrodes 2 are provided; however, they are typically arranged on both sides of the surfaces of component 10.

First, molten solder 5a sprayed from spraying nozzles 33 will be described. For molten solder 5a, solder is used which is molten through heating and which is fluidized to such a degree that it can be sprayed as liquid current 5'. The heating temperature thereof is arbitrarily selected depending on the solder composition; however, a favorable temperature is typically set from the range between 150° C. and 300° C., inclusive. In the present invention, molten lead-free solder is used, which contains tin as a primary constituent and nickel at least as an accessory constituent and which also arbitrarily contains, as another accessory constituent, one constituent, two or more constituents selected from silver, copper, zinc, bismuth, antimony and germanium.

The preferred solder composition is an Sn—Ni—Ag—Cu—Ge alloy. In particular, a solder alloy, which contains: nickel between 0.01 mass % and 0.5 mass %, inclusive; silver between 2 mass % and 4 mass %, inclusive; copper between 0.1 mass % and 1 mass %, inclusive; germanium between 0.001 mass % and 0.02 mass %, inclusive; and the remainder being tin, is preferably used in order to form CuNiSn intermetallic compound 4 (see FIG. 11(B)), which can prevent electrode erosion in a stable manner. The composition that is particularly preferable for forming such CuNiSn intermetallic compound 4 is a solder alloy that contains: nickel between 0.01 mass % and 0.07 mass %, inclusive; silver between 0.1 mass % and 4 mass %, inclusive; copper between 0.1 mass % and 1 mass %, inclusive; germanium between 0.001 mass % and 0.01 mass %, inclusive; and the remainder being tin. When soldering using such Sn—Ni—Ag—Cu—Ge alloy, it is preferable to use such Sn—Ni—Ag—Cu—Ge alloy as molten solder 5a having a temperature between 240° C. and 260° C., inclusive.

Solder containing bismuth can further lower the temperature for heating molten solder 5a. By conditioning the component composition thereof, the heating temperature may be decreased to as low as, for example, close to 150° C. Such decrease in temperature can also decrease the temperature of the vapor in space portion 143 and thus, it is more preferable. Similar to the above, the composition of the solder containing bismuth preferably contains nickel between 0.01 mass % and 0.5 mass %, inclusive, and more preferably contains nickel between 0.01 mass % of 0.07 mass %, inclusive. In this way, low-temperature type molten solder 5a can be obtained, which can easily form CuSn intermetallic compound layer 4.

In addition, other zinc and antimony are also combined as may be necessary. In any case, the solder composition preferably contains at least nickel between 0.01 mass % and 0.5 mass %, inclusive, and more preferably contains nickel between 0.01 mass % and 0.07 mass %, inclusive.

Since molten solder 5a of the above-described composition is lead-free solder that does not contain lead and always contains nickel of the above-described content, as shown in FIG. 11(B), nickel contained in molten solder 5a combines with copper in electrode 2 and further combines with tin in molten solder 5a and thus, CuNiSn intermetallic compound layer 4 is easily formed on the surface of electrode 2. The formed CuNiSn intermetallic compound layer 4 acts as an electrode erosion prevention layer of electrode 2 and also behaves so as to prevent the loss or disappearance of electrode 2. Accordingly, solder layer 5 having CuNiSn intermetallic compound layer 4 can, thereafter, easily endure treatment, which can be considered as being severe on electrode 2, such as when providing a substrate formed with such solder layer 5 to a dipping process, in which such substrate is dipped into a solder bath. Therefore, even when a low-cost dipping process is applied, highly reliable solder layer 5 can be formed with a high yield. In addition, a mounting substrate can be obtained, onto which mounting of electrical components that utilizes such solder layer 5 can be performed in a highly reliable manner with low cost and a high yield.

It has been found that the nickel content contained in molten solder 5a influences the thickness of CuNiSn intermetallic compound layer 4. In particular, when the nickel content is in the range of between 0.01 mass % and 0.5 mass %, inclusive (preferably, 0.07 mass % or less), CuNiSn intermetallic compound layer 4 having a substantially uniform thickness between 1 μm and 3 μm, inclusive, can be produced. CuNiSn intermetallic compound layer 4 having a thickness in this range can prevent copper in electrode 2 from being blended into and eroded in molten solder 5a or solder layer 5.

When the nickel content is 0.01 mass %, the thickness of CuNiSn intermetallic compound layer 4 becomes between approximately 1 μm and 1.5 μm, inclusive, when the nickel content is, for example, 0.07 mass %, the thickness of CuNiSn intermetallic compound layer 4 becomes approximately 2 μm, and when the nickel content is 0.5 mass %, the thickness of CuNiSn intermetallic compound layer 4 becomes approximately 3 μm.

When the nickel content is less than 0.01 mass %, the thickness of CuNiSn intermetallic compound layer 4 becomes less than 1 μm, places where CuNiSn intermetallic compound layer 4 cannot fully cover electrode 2 occur, and erosion of copper may be likely to occur from such places. When the nickel content exceeds 0.5 mass %, the thickness of hard CuNiSn intermetallic compound layer 4 becomes even thicker, exceeding 3 μm, and cracks may occur in CuNiSn intermetallic compound layer 4. As a result, erosion of copper may be likely to occur from such cracked portions. It should be noted that the preferable nickel content is between 0.01 mass % and 0.07 mass %, inclusive. As compared to molten solder 5a having a nickel content of either in excess of 0.07 mass % or 0.5 mass % or less, molten solder 5a having a nickel content in the above-described range has no possibility of generating cracks in CuNiSn intermetallic compound layer 4 and is capable of forming a smooth and uniform layer.

Purification Treatment

Solder used as molten solder 5a has preferably gone through purification treatment. In particular, a solution containing an organic fatty acid having a carbon number of 12 to 20 in the concentration of between 5 mass % and 25 mass %, inclusive, is heated to between 180° C. and 350° C., inclusive, and the heated solution and molten solder 5a are made to contact with each other and are intensively agitated and mixed. In this way, molten solder 5a, prior to purification treatment, which is contaminated by copper oxide, flux component or the like can be cleaned and thus, molten solder 5a removed of copper oxide, flux component or the like can be obtained. Thereafter, the solution containing molten solder 5a removed of copper oxide, flux component or the like is poured into a storage bath (not shown) for the solution containing organic fatty acid. Cleaned molten solder 5a, which is separated in the storage bath for the solution containing organic fatty acid based on the specific gravity difference, is pumped back into a lead-free solder liquid storage bath from the bottom of the storage bath for the solution containing organic fatty acid. By performing such purification treatment, it is possible to suppress any temporal increase in the copper concentration and the impurity concentration in molten solder 5a to be used as a liquid current and also to prevent copper oxide or impurities such as flux residue or the like from being brought into the lead-free solder liquid storage bath. Consequently, since temporal composition change of molten solder 5a in the lead-free solder liquid storage bath can be suppressed, solder layers 5 can be continuously formed which make use of stable molten solder 5a having a high bonding reliability. In addition, mounting substrates, which are provided with such solder layers 5, can also be continuously produced.

Refined molten solder 5a does not contain copper oxide or impurities, such as flux residue or the like, that affect the bonding quality of solder layer 5. Moreover, such molten solder 5a has a lower viscosity as compared to untreated molten solder. As a result, when forming solder layers 5 on finely-patterned electrodes 2, such solder layers 5 can be formed evenly over such electrodes 2 and thus, variations in bonding quality between solder layer 5 and the electrical component among lots are removed and contributions can be made to the temporal quality stability.

An organic fatty acid contained in the organic fatty acid-containing solution that is used for purification is the same as the one contained in the above-described organic fatty acid-containing solution 131 and thus, an explanation thereof will be omitted here. It should be noted that the temperature of the organic fatty acid-containing solution that is used for purification is determined by a melting point of molten solder 5a to be refined. The solution containing organic fatty acid and molten solder 5a are intensively agitated and make contact with each other at a high temperature region (for example, 240° C. to 260° C.) which is at least at the melting point or higher of molten solder 5a. In addition, the upper limit temperature of the solution containing organic fatty acid is approximately 350° C. in terms of the smoke generation problem or energy saving, and is desirably in the range of between the temperature of the melting point, or higher, of molten solder 5a to be refined, and 300° C., inclusive. For example, a solder alloy containing: nickel between 0.01 mass % and 0.07 mass %, inclusive; silver between 0.1 mass % and 4 mass %, inclusive; copper between 0.1 mass % and 1 mass %, inclusive; germanium between 0.001 mass % and 0.01 mass %, inclusive; and the remainder being tin, is used as molten solder 5a at a temperature between 240° C. and 260° C., inclusive, and thus, the temperature of the solution containing organic fatty acid is also preferably between 240° C. and 260° C., inclusive, as above. It should be noted that when the low-temperature solder is used, the temperature of organic fatty acid-containing solution 131 can also be made low in accordance with the temperature of such solder.

As shown in FIGS. 3 to 5, molten solder 5a that has been refined by the solution containing organic fatty acid is sprayed, as liquid current 5', toward component 10 from adhesion unit 33 while it is being pulled upward from organic fatty acid-containing solution 131. The pressure of molten solder 5a to be sprayed from adhesion unit 33 is not particularly limited, and is determined in an arbitrary manner depending on the type, temperature, viscosity and the like of molten solder 5a. Typically, molten solder 5a is sprayed at a pressure of approximately 0.3 MPa to 0.8 MPa. As described above, the atmospheric temperature is preferably at a temperature the same as or close to the liquid current temperature of molten solder 5a (preferably, the atmospheric temperature is slightly higher than the liquid current temperature). In this way, as shown in FIGS. 5 and 8(C), molten solder 5a being attached to and raised from electrode 2 is provided. The flow rate and the spraying treatment time of liquid current 5' of molten solder 5a to be sprayed from adhesion unit 33 are arbitrarily set by taking the type, etc. of molten solder 5a into consideration. In addition, the shape and conditions such as the spraying angle, etc. of adhesion unit 33 are also arbitrarily applied or set by taking the type, etc. of molten solder 5a into consideration.

Next, removal unit 34 that removes excessive molten solder will be described. Excessive solder removal unit 34 is a unit for removing excessive molten solder 5a out of molten solder 5a adhered by means of the above-described adhesion unit 33.

As shown in FIG. 4, component 10 having molten solder 5a placed thereon moves horizontally within space portion 143 after being pulled up into space portion 143, and thereafter, excessive molten solder 5a can be removed by spraying organic fatty acid-containing solution 131 onto such excessive molten solder 5a. This removal process is a process which is carried out, while lowering component 10 into organic fatty acid-containing solution 131, by spraying organic fatty acid-containing solution 131 from removal unit 34, which is positioned in the midway from space portion 143. By this removal process, molten solder 5a placed on electrode 2 in a raised manner as shown in FIGS. 8(C) and 10 is removed, and only molten solder 5a that cannot be removed can remain. Molten solder 5a that cannot be removed refers to molten solder 5a which is caused to adhere to CuNiSn intermetallic compound layer 4 formed on electrode 2, and such adhered molten solder 5a forms solder layer 5.

As shown in FIG. 5, it is possible to preferably apply a method in which, while component 10 is being pulled upward into space portion 143 that configures the upper fourth treatment part 140, liquid current 5' of molten solder 5a is sprayed from spraying nozzles 33, which are set so as to face both surface sides of substrate 10, and in which, subsequently, component 10 is once lowered and, while it is being pulled upward again into space portion 143, excessive molten solder 5a on component 10 is removed.

The organic fatty acid-containing solution for removing molten solder 5a is the same or substantially the same as organic fatty acid-containing solution 131 contained in third treatment part 130. Since space portion 143 contains a vapor atmosphere of organic fatty acid-containing solution 131, the same organic fatty acid-containing solution as organic fatty acid-containing solution 131 that constitutes space portion 143 is used in treatment part 130. It should be noted that inert gas such as nitrogen gas or the like may be partially mixed. On the other hand, air, water or the like that contains oxygen is not mixed in terms of oxidization of solder layer 5 and compatibility with respect to the solution containing organic fatty acid. The pressure of organic fatty acid-containing solution 131 sprayed from removal unit 34 is not particularly limited, and is set in an arbitrary manner depending on the type, temperature, viscosity, etc. of molten solder 5a. Typically, it is sprayed at a pressure of approximately 0.2 MPa to 0.4 MPa.

The temperature of organic fatty acid-containing solution 131, which is used as a spraying liquid, is preferably the same or substantially the same as the temperature of molten solder 5a (for example, approximately 250° C., or approximately 150° C. in the case of low temperature solder). In this way, excessive molten solder 5a can be blown off and, at this moment, organic fatty acid coating layer 6 (see FIGS. 8(D) and 13(B)) is formed on the exposed surface of molten solder 5a.

Reuse of Molten Solder

Although it is not shown, molten solder 5a that has been sprayed from adhesion unit 33 and molten solder 5a that has been removed by means of removal unit 34 are settled at the bottom of third treatment part 130, which is located below space portion 143, based on the specific gravity. A circulation device (not shown) for collecting and reusing the settled molten solder 5a may be provided. Such circulation device may convey molten solder 5a accumulated at the bottom of third treatment part 130 to adhesion unit 33 that sprays molten solder 5a.

It should be noted that organic fatty acid-containing solution 131 and molten solder 5a are separated based on the specific gravity and that molten solder 5a settled at the bottom of third treatment part 130 may be taken out and separated from organic fatty acid-containing solution 131. Molten solder 5a and organic fatty acid-containing solution 131 separated in this manner may be reused, as needed, after filtering treatment or the like is applied thereto.

(Fifth Treatment Part/Fifth Treatment Process)

Fifth treatment part 150 is a treatment part that moves treated component 11 horizontally, which has been moved downward from fourth treatment part 140.

Treated component 11, which has been moved downward from fourth treatment part 140, again makes contact with organic fatty acid-containing solution 131 through immersion or the like in fifth treatment part 150. For example, as shown in FIG. 3, fifth treatment part 150 is located in the same bath as that of the space-saving type third treatment part 130. Fifth treatment part 150 is a different treatment part from third treatment part 130; however, it constitutes a region that holds the same organic fatty acid-containing solution 131 in common and exists as an extension of third treatment part 130.

The temperature of organic fatty acid-containing solution 131 in fifth treatment part 150 is, as described above, the same as that of the respective parts in third treatment part 130. Since organic fatty acid-containing solution 131 and the contained components, etc. are also as described above, an explanation thereof will be omitted here.

The lowered component 11 is loaded onto cassette 116 and this component-loaded cassette 116 moves horizontally to a location directly below sixth treatment part 160. The conveyance of cassette 116 is not particularly limited; however, in a similar manner to the above-described conveyance of cassette 115, it can be performed, for example, by means of cassette conveying device 152 such as that shown in FIG. 2. Cassette conveying device 152 is composed of conveying wire 153, conveying motor 154 and conveying roller 155. Cassette 116 may, by means of cassette conveying device 152, be reciprocated in a repeated manner between at least fifth treatment part 150 and sixth treatment part 160.

(Sixth Treatment Part/Sixth Treatment Process)

Sixth treatment part 160 is a treatment part that is separated in a sealable manner by third opening-closing unit 159, which is provided between fifth treatment part 150 and sixth treatment part 160, and that sends out component 11, which is fed from fifth treatment part 150, to the subsequent seventh treatment part 170.

In sixth treatment part 160, a shutter of third opening-closing device 159 is closed until component-loaded cassette 116 is fed from fifth treatment part 150. The shutter opens immediately before component-loaded cassette 116 is fed in. After the shutter opens, component-loaded cassette 116 is conveyed upward from fifth treatment part 150. Immediately thereafter, the shutter of third opening-closing device 159 is closed and subsequently a shutter of fourth opening-closing device 169 is opened so as to send out only component 11 from component-loaded cassette 116 to seventh treatment part 170.

After component 11 is sent in to seventh treatment part 170, it is preferred that the shutter of fourth opening-closing device 169 is closed and that the mist or odor of organic fatty acid-containing solution 131 in sixth treatment part 160, which has entered from fifth treatment part 150, is changed through purging with air, inert gas or the like. In this way, the mist or odor of organic fatty acid-containing solution 131 used in fifth treatment part 150 can be prevented from flowing from sixth treatment part 160 into seventh treatment part 170 to be leaked to the outside. It should be noted that the mist or odor that is changed through purging may be treated by a deodorizing device or an adsorption device.

The gripping of component 11 out from component-loaded cassette 116 may be performed by means of grip/hold device 191, such as that shown in FIG. 3. Grip/hold device 191 is not particularly limited; however, a device may be illustrated, which has a grip part 192 and in which ascending-descending shaft 193 is controlled such that it moves upward or downward by means of ascending-descending motor 144.

In sixth treatment part 160, an air knife (not shown) may be provided as may be necessary. The air knife is preferably applied so as to drain off organic fatty acid-containing solution 131, which is adhered to the surface of component 11 drawn up from fifth treatment part 150. Through this draining off of the solution, excessively adhered organic fatty acid-containing solution 131 can be removed. For such draining off of the solution, an air nozzle or the like is preferably used. The spraying pressure of the air nozzle or the like at this time is not particularly limited and is arbitrarily determined based on the size and shape of component 11. In this way, treated component 11 is obtained.

(Seventh Treatment Part/Seventh Treatment Process)

Seventh treatment part 170 is a treatment part that is separated in a sealable manner by fourth opening-closing unit 169, which is provided between sixth treatment part 160 and seventh treatment part 170, and that takes out component 11, which is fed from sixth treatment part 160. Components 11, which are fed into seventh treatment part 170, are arranged, for example, in a sequential manner as shown in FIG. 2, and are taken out from soldering device 100 through take-out door 104 shown in FIG. 1.

(Others)

Reference marks A1, A2, A3, A4, A5, A6, A7, A8 and A9 illustrated in FIGS. 3 to 5 represent directions of movement of the component or component-loaded cassette and reference mark B indicates the returning direction of the cassette. Circulation device part 102 that configures soldering device 100 is a device for circulating molten solder 5a and organic fatty acid-containing solution 131 and is composed of pump 201, branching device 202, piping 203, 204, pump 301, branching device 302, tank 303, branching device 304, joining part 305 and branching parts 306, 307. These components may be designed in an arbitrary manner and a configuration different from that shown in FIG. 2 may also be employed.

In addition, as shown in FIGS. 1 to 3, soldering device 100 is provided with a sealing cover that covers the entirety thereof and the space between the respective treatment parts 110 to 170 also has a sealed structure in conjunction with the above-described opening-closing devices. In this way, it is possible that: evaporable organic fatty acid-containing solution 131 is prevented from being evaporated and diffused to the outside; and that contaminants from outside are prevented from entering into the device.

When obtained component 11 is a substrate such as a printed circuit board or the like, electrode erosion prevention layer 4, the minimum solder layer 5 and organic fatty acid coating layer 6 are provided, in this order, on the surface of electrode 2 of such substrate. Accordingly, even when such substrate is dipped into various molten solder baths, introduced into a reflow furnace after solder in a paste form is printed, or introduced into a firing furnace in the mounting process thereof, treatment can be done in the subsequent mounting processes with no electrode erosion of electrode 2 and with no damaging to the solder wettability.

Even when obtained component 11 is an electrical component, electrode erosion prevention layer 4, the minimum solder layer 5 and organic fatty acid coating layer 6 are provided, in this order, on the surface of electrode 2 of such electrical component. Accordingly, even when such electrical component is dipped into various molten solder baths, introduced into a reflow furnace after solder in a paste form is printed, or introduced into a firing furnace in the mounting process thereof, treatment can be done in the subsequent mounting processes with no electrode erosion of electrode 2 of the electrical component and with no damaging to the solder wettability.

As described above, in soldering device 100 and the method thereof according to the present invention, since component 10 passes through, in a sequential manner, the respective treatment parts 110 to 170 having a space-saving structure, the individual treatment time at the respective treatment parts can be set in an arbitrary manner and the size of each treatment part can be designed in accordance with such respective treatment time. As a result, miniaturization of the device can be achieved by way of saving space, and a low-cost and efficient soldering device can be obtained. Moreover, since third treatment part 130, in which organic fatty acid-containing solution 131 is used for treatment, can be separated in a sealable manner by means of opening-closing units 119, 129, 159 and 169, which allow for miniaturization and the saving of space, it is possible to decrease the size of the entire device as well as to prevent oil odor of organic fatty acid-containing solution 131 from leaking to the outside. Further, since third treatment part 130 and fourth treatment part 140 are provided, electrode erosion prevention layer 4 can be formed with a uniform thickness on the electrode surface, which is cleaned by means of organic fatty acid-containing solution 131, while generating as few voids or defects therein as possible. Consequently, solder 5 which is provided on such electrode erosion prevention layer 4 can also be made to generate as few voids or defects therein as possible. With such device and method, substrates and electrical components having highly reliable electrodes, which constitute electrical connection parts, can be produced at low cost with a high yield.

In addition, after making contact with organic fatty acid-containing solution 131, while component 10 is pulled upward into space portion 143 having a vapor atmosphere of organic fatty acid-containing solution 131, liquid current 5' of molten solder 5a is sprayed onto electrodes 2 provided on component 10 so as to cause molten solder 5a to adhere to electrodes 2, and then, while lowering component 10 from space portion 143 or pulling component 10 upward again, excessive molten solder 5a is removed by spraying organic fatty acid-containing solution 131 onto such excessive molten solder 5a. Thus, electrode erosion prevention layer 4 can be formed in a uniform manner on the cleaned electrode surface without any defects. Then, organic fatty acid coating layer 6 is provided by causing component 10 to make contact with organic fatty acid-containing solution 131 again, after excessive molten solder 5a is removed. Accordingly, even when such component 10 is dipped into various molten solder baths, introduced into a reflow furnace after solder in a paste form is printed, or introduced into a firing furnace in the subsequent mounting process, treatment can be done in the subsequent mounting processes with no electrode erosion of electrode 2 and with no damaging to the solder wettability.

[Produced Substrate and Electrical Component]

Figure 7:
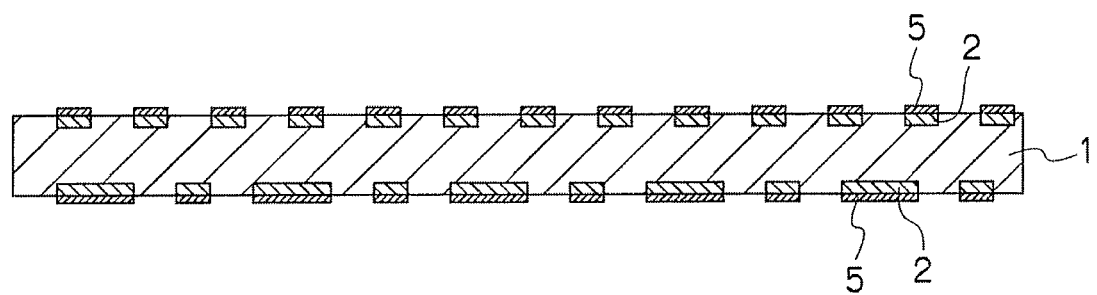
FIG. 7 is a schematic cross-sectional view illustrating an example of a substrate (member to be treated) after treatment.

Substrate 10 according to the present invention is, as shown in FIGS. 7 and 8(D), a substrate produced by means of soldering device 100 or by way of the soldering method according to the present invention. Electrode 2 of substrate 10 is provided, from the surface thereof, with electrode erosion prevention layer 4, solder layer 5 and organic fatty acid coating layer 6, in this order. Examples of substrate 10 include various substrates such as a printed circuit board, a wafer, a flexible substrate or the like. In particular, regarding wafers, since the width or the pitch of the electrode thereof is small, the soldering device and the method thereof according to the present invention are preferably applied thereto and thus, solder layers 5 can be provided, in a precise manner, onto narrow-pitched microscopic electrodes. Moreover, in the case of printed circuit boards or flexible substrates onto which larger electrical components are provided, since the surfaces of solder layers 5 are maintained in a cleaned condition or can be treated in the subsequent processes, they can be used as highly reliable substrates.

In addition, the electrical component according to the present invention is, as shown in FIGS. 13 and 14, electrical component 40, 51, 52 produced by means of soldering device 100 or by way of the soldering method according to the present invention. Electrode 2 of such electrical component 40, 51, 52 is provided, from the surface thereof, with electrode erosion prevention layer 4, solder layer 5 and organic fatty acid coating layer 6, in this order. Examples of the electrical component include a semiconductor chip, a semiconductor module, an IC chip, an IC module, a dielectric chip, a dielectric module, a resistor chip, a resistor module or the like.

With these substrates and electrical components, even when heat is applied subsequently in a reflow furnace, a firing furnace or the like, electrode erosion of electrodes 2 is blocked by means of electrode erosion prevention layers 4. Consequently, since these substrates and electrical components can be produced without decreasing the reliability of an electrical connection part (electrode part) during the mounting processes of the electrical components, which are performed through various processes and even with a high yield; it is possible to provide low cost and highly reliable substrates and electrical components.

[Another Embodiment of Soldering Device]

As shown in FIGS. 15 and 16, soldering device 400 according to another embodiment of the present invention includes: first treatment bath (entrance bath) 401 in which component (hereinafter, this will be referred to as a "substrate to be treated") 500 having electrodes for soldering is set; second treatment bath (low temperature treatment liquid bath) 402 that sends out the treated substrate, which is fed from first treatment bath 401, to the subsequent third treatment bath 403: third treatment bath (high temperature treatment bath) 403 that causes the treated substrate, which is fed from second treatment bath 402, to make contact with a solution containing organic fatty acid; fourth treatment bath 404 that has a molten solder adhesion unit (soldering treatment bath), which causes molten solder to be adhered to the electrodes of the treated substrate treated in third treatment bath 403, and a molten solder removal unit (molten solder removal bath) that removes excessive molten solder out of the adhered molten solder; fifth treatment bath (solution removal treatment bath) 405 that treats the treated substrate treated in fourth treatment bath 404 with a gas or liquid; sixth treatment bath (connecting bath) 406 that sends out the treated substrate, which is fed from fifth treatment bath 405, to the subsequent seventh treatment bath 407; and seventh treatment bath (exit bath) 407 that takes out treated substrate 600, which is fed from sixth treatment bath 406.

A detailed description will be provided hereinafter.

Soldering device 400 shown in FIGS. 15 and 16 is composed of first treatment bath 401, second treatment bath 402, third treatment bath 403, fourth treatment bath 404, fifth treatment bath 405, sixth treatment bath 406 and seventh treatment bath 407. Five treatment baths including from second treatment bath 402 to sixth treatment bath 406 are arranged in treatment tank 431. The arrangement condition is such that the respective elongated treatment baths are radially directed from the inside to the outside in an outwardly and equally spaced manner (for example, with 72° intervals) centering around arm rotating shaft 432. It should be noted that such intervals may not be equal.

First treatment bath 401 and seventh treatment bath 407 are arranged outside of treatment tank 431; however, as shown in FIG. 16, first treatment bath 401 is connected to second treatment bath 402 at the bottom, and seventh treatment bath 407 is also connected to sixth treatment bath 406 at the bottom. Each treatment bath 401, 402, 406, 407 is provided with a vertical space having a size sufficient large to let substrate 500 to be treated or treated substrate 600 pass therethrough, and substrate 500 to be treated or treated substrate 600 slides and moves in such space.

On a side of first treatment bath 401, entrance stack 411 is arranged for accommodating substrates 500 to be treated. Substrates 500 to be treated are received in this entrance stack 411. On the other hand, on a side of seventh treatment bath 407, exit stack 421 is arranged for accommodating treated substrates 600. Treated substrates 600 are received in this exit stack 421.

The respective treatment baths are arranged inside a cover that covers the entirety; however, entrance stack 411 and exit stack 421 are arranged such that portions thereof protrude out of cover 433 so that substrates can be taken in or taken out from the outside of cover 433.

Substrate 500 to be treated is one type of component provided with electrodes to be treated with soldering treatment. The type of substrate is not particularly limited; however, it may be a sheet-like substrate. Only one or both surfaces may be treated.

Substrate 500 to be treated is introduced from entrance stack 411 of first treatment bath 401. This introduction is made by robotic arm 436 and by gripping member 437, which is provided at the tip of robotic arm 436, gripping and holding substrate 500 to be treated. First treatment bath 401 contains an organic fatty acid solution. Since first treatment bath 401 and second treatment bath 402 are connected to one another, second treatment bath 402 also contains the organic fatty acid solution. The temperature of the organic fatty acid solution is not particularly limited; however, it is preferably not so high and it is sufficient when it is approximately 50° C. to 80° C. By making the temperature of the organic fatty acid solution relatively low, generation of odor or smoke from the organic fatty acid solution and smoke generation can be suppressed. It should be noted that first treatment bath 401 has a structure in which, as soon as the arm lifts upward, a lid thereof closes and seventh treatment bath 407 also has a structure in which, as soon as the arm lifts upward, a lid thereof closes.

Substrate 500 to be treated, which has entered first treatment bath 401, is moved by means of sliding member 438 from first treatment bath 401 to second treatment bath 402. Such moving means is not particularly limited; however, for example, as shown in FIG. 16, the movement may be achieved by means of sliding rack 501 that is reciprocated between first treatment bath 401 and second treatment bath 402. Sliding rack 501 is moved by means of sliding member 438 and the driving for such movement can be achieved by gripping member 437 transferring the driving to sliding member 438. For example, by way of gripping member 437 making rotations, sliding member 438 functions so as to cause sliding rack 501 to be reciprocated. It should be noted that the same principle of movement is applied to the movement between sixth treatment bath 406 and seventh treatment bath 407. It should also be noted that reference mark 412 denotes an introduction device, reference mark 413 denotes an arm extending out from such introduction device, reference mark 422 denotes an exit device and reference mark 423 denotes an arm extending out from such exit device.

The substrate to be treated, which has moved to second treatment bath 402, is gripped by the tip of suspension arm 435, which is provided at the tip of pivoting arm 434, and is pulled upward. The substrate to be treated, which is pulled upward, is, as shown in FIG. 15, pivoted to the location of third treatment bath 403 and is lowered by means of pivoting arm 434, and is introduced into third treatment bath 403 while still being gripped by suspension arm 435.

Third treatment bath 403 is a bath in which the heated organic fatty acid solution is contained and the substrate to be treated is treated with such organic fatty acid solution. The temperature of the organic fatty acid solution is as described above, and thus, an explanation thereof and a description of the effect will be omitted here.

The treated substrate is pulled upward by means of suspension arm 435 and, as shown in FIG. 15, is pivoted to the location of fourth treatment bath 404 and is lowered by means of pivoting arm 434 and is introduced into fourth treatment bath 404 while still being gripped by suspension arm 435.

Fourth treatment bath 404 is a bath in which treatment for causing molten solder to be adhered and treatment for removing excessive molten solder out of the adhered molten solder are performed. The adhesion of the molten solder may be achieved by filling bath 404 with molten solder and by immersion therein or the molten solder may be sprayed onto the substrate surface(s). In addition, the removal of the excessive molten solder is achieved by spraying gas such as nitrogen gas, air or the like, or the organic fatty acid solution onto the substrate surface(s) to remove excessive solder adhered onto the substrate surface(s).

Fourth treatment bath 404 may be provided with solder circulation tank 441, filter 442 and gear pump 443. Solder circulation tank 441 preferably circulates solder even in the case of immersion or spraying. Filter 442 is for separating impurities mixed into the solder and the organic fatty acid solution and a cyclone filter may preferably be applied.

The treated substrate is pulled upward by means of suspension arm 435, and, as shown in FIG. 15, is pivoted to the location of fifth treatment bath 405 and is lowered by means of pivoting arm 434 and is introduced into fifth treatment bath 405 while still being gripped by suspension arm 435.

Fifth treatment bath 405 is a bath for treating the treated substrate with a gas or liquid. In particular, the organic fatty acid solution adhered to the substrate surface(s) is cleaned. Means for archiving such cleaning includes air spraying, inert gas spraying or the like. Alternatively, any cleaning solution may be filled and the substrate may be treated with such cleaning solution.

The treated substrate is pulled upward by means of suspension arm 435 and, as shown in FIG. 15, is pivoted to the location of sixth treatment bath 406 and is lowered by means of pivoting arm 434 and is introduced into sixth treatment bath 406 while still being gripped by suspension arm 435.

Sixth treatment bath 406 contains a solvent for isolating the atmosphere in the treatment tank and the outside atmosphere. The solvent may be the above-described organic fatty acid solution or any other organic solution, such as alcohol or the like. It should be noted that the organic fatty acid solution contained in first treatment bath 401 and second treatment bath 402 also include a solvent for isolating the atmosphere in the treatment tank and the lower atmosphere. The isolation between the atmosphere in the treatment tank and the atmosphere outside the treatment tank, by means of such solvent is a technical aspect which is extremely important in the soldering device according to the present invention. By means of such isolation, an advantage is provided to the effect that the high temperature atmosphere and the organic fatty acid solution atmosphere in the treatment tank are both prevented from being diffused to the outside.

As described above, according to soldering device 400 shown in FIGS. 15 and 16 and the soldering method making use of such device, the treatment time at each treatment bath can be set so as to be short and sequential treatment can be achieved by pivoting the arm. Consequently, significant space-saving of the device and miniaturization thereof can be achieved and thus, a low cost and efficient soldering device can be obtained. In addition, since effective isolation can be made, leakage of oil odor from the solution containing organic fatty acid to the outside can be prevented. Moreover, since an electrode erosion prevention layer can be formed on the electrode surface, which is cleaned with the solution containing organic fatty acid, erosion of the electrode can be prevented and it is also possible to generate as few voids or defects as possible in the solder provided on such electrode erosion prevention layer. According to such device and method, substrates and electrical components having highly reliable electrodes, which constitute electrical connection parts, can be produced at low cost with a high yield.

EXAMPLES

Hereinafter, the Examples and a Comparative Example are given in order to describe the present invention more specifically Example 1

As an example, substrate 10 was prepared, in which a copper wiring pattern having a width of, for example, 200 μm and a thickness of, for example, 10 μm was formed in base material 1. In this substrate 10, only a plurality of electrodes 20 constituting a mounting part of an electrical part, each electrode having a width of, for example, 200 μm and a length of, for example, 50 μm, were exposed out of the copper wiring pattern and the rest of the copper wiring pattern was covered with an insulation layer.

As organic fatty acid-containing solution 131 to be poured into third treatment part 130, organic fatty acid-containing solution 131 was prepared, in which palmitic acid was added to ester synthesis oil, which did not contain metallic salt such as nickel salt, cobalt salt or the like, nor did it contain an autoxidizing agent or the like, such that the concentration of the acid was 10 mass %. The temperature of organic fatty acid-containing solution 131 contained in third treatment part 130 was controlled to be at 250° C. As for molten solder 5a, quinary lead-free solder composed of 0.05 mass % of Ni, 0.005 mass % of Ge, 3 mass % of Ag, 0.5 mass % of Cu, and the remainder being Sn, was used and heated to 250° C. so as to prepare molten solder 5a.

After the introduction of nitrogen gas, the upper space of space portion 143 was filled with vapor of organic fatty acid-containing solution 131 by increasing the temperature of organic fatty acid-containing solution 131 to 250° C. Substrate 10 was introduced into thus prepared soldering device 100.

Substrate 10 was set in first treatment part 110. Substrate 10 was gripped by grip/hold device 111 in first treatment part 110, fed to second treatment part 120, and loaded onto cassette 115. Thereafter, the shutter of first opening-closing device 119 was closed and substrate 10 loaded onto cassette 115 was fed to third treatment part 130. After substrate 10 was fed to third treatment part 130, the shutter of second opening-closing device 129 was closed. Substrate 10 was immersed in organic fatty acid-containing solution 131 contained in third treatment part 130, and organic fatty acid coating layer 3 was provided on electrode 2 (see, for example, FIG. 8(B)). Organic fatty acid coating layer 3 was adhered thereto as a result of cleaning the copper surface with organic fatty acid-containing solution 131. After moving substrate 10 horizontally from third treatment part 130, as shown in FIGS. 7 and 9, while pulling substrate 10 upward into the upper fourth treatment part 140, liquid current 5' of molten solder 5a at, for example, a temperature of 250° C., was sprayed from spraying nozzles 33, which were set so as to face both surface sides of substrate 10. On electrode 2, to which molten solder 5a was sprayed, as shown in FIG. 8(C), molten solder 5a was adhered thereto in a raised condition.

Subsequently, as shown in FIGS. 4 and 7, substrate 10 was moved in the horizontal direction within space portion 143 of fourth treatment part 140 and then, while lowering substrate 10, excessive molten solder 5a on substrate 10 was removed. Such removal was performed by using spraying nozzles 34, which were set, for example, at an angle of 30° with respect to both surfaces of substrate 10. Organic fatty acid-containing solution 131 at, for example, a temperature of 250° C. was sprayed from spraying nozzles 34. Consequently, substrate 11, in the condition shown in FIG. 8(D), was obtained. It should be noted that substrate 11 was provided, on electrode 2 thereof, with electrode erosion prevention layer 4, solder layer 5 and organic fatty acid coating layer 6, in this order. Subsequently, substrate 11 was moved in the horizontal direction within fifth treatment part 150 and then, the shutter of third opening-closing device 159 was opened and substrate 11 was pulled upward into sixth treatment part 160 above fifth treatment part 150. While substrate 11 was pulled up, the solution was drained off by means of air spraying from air nozzles 39. After substrate 11 was pulled upward into sixth treatment part 160, the shutter was closed. Subsequently, the shutter of fourth opening-closing device 169 was opened and substrate 11 was moved into seventh treatment part 170. In this way, substrate 11 was obtained.

Example 2

Except for the fact that the treatment within fourth treatment part 140 in Example 1 was substituted by the treatment shown in FIG. 5, Example 2 was carried out in a similar manner to that of Example 1 and thus, substrate 11 of Example 2 was obtained. In particular, while substrate 10 was pulled upward into the upper fourth treatment part 140, liquid current 5' of molten solder 5a at, for example, a temperature of 250° C., was sprayed from spraying nozzles 33, which were set so as to face both surface sides of substrate 10. Then, as shown in FIG. 5, substrate 10 was once lowered and, while it was pulled upward again into space portion 143, excessive molten solder 5a on substrate 10 was removed.

Comparative Example 1

Except for the fact that ternary lead-free solder composed of 3 mass % of Ag, 0.5 mass % of Cu, and the remainder being Sn, was used as the solder material in Example 1, Comparative Example 1 was carried out in a similar manner to that of Example 1 and thus, a substrate of Comparative Example 1 was obtained. No CuNiSn intermetallic compound layer existed on electrode 2 of the substrate, but instead, CuSn intermetallic compound layer 7 was formed (See FIG. 11(A)).

DESCRIPTIONS OF REFERENCE NUMERALS

1 Base material
2 Electrodes
3 Coating layer
4 Electrode erosion prevention layer
5 Solder layer
5' Liquid current of molten solder
5a Molten solder
6 Coating layer
7 CuSn compound layer
10 Component (substrate or electrical component)
11 Treated substrate (substrate or electrical component)
33 Adhesion unit (spraying nozzle of molten solder)
34 Adhesion unit (spraying nozzle of organic fatty acid-containing solution)
40 Electrical component
41 Element
42 Holding jig of an electronic component
51, 52 Semiconductor chip
100 Soldering device
101 Treatment part
102 Circulation device part
103 Carry-in door
104 Take-out door
105 Viewing window
110 First treatment part
111 Grip/hold device
112 Grip part
113 Ascending-descending shaft
114 Ascending-descending motor
115 Cassette
116 Cassette
119 First opening-closing device
120 Second treatment part
121 Heater
122 Cassette conveying device
123 Conveying wire
124 Conveying motor
125 Conveying roller
129 Second opening-closing device
130 Third treatment part
131 Organic fatty acid-containing solution
140 Fourth treatment part
141 Piping for molten solder
142 Piping for organic fatty acid-containing solution
143 Space portion
148 Drain
150 Fifth treatment part
152 Cassette conveying device
153 Conveying wire
154 Conveying motor
155 Conveying roller
159 Third opening-closing device
160 Sixth treatment part
169 Fourth opening-closing device
170 Seventh treatment part
181 Grip/hold device
182 Grip part
183 Ascending-descending shaft
192 Grip part
193 Ascending-descending shaft
194 Ascending-descending motor
201 Pump
202 Branching device
203, 204 Piping
301 Pump
302 Branching device
303 Tank
304 Branching device
305 Joining part
306, 307 Branching part
A1, A2, A3, A4, A5, A6, A7, A8, A9 Directions of movement of a component
B Returning direction of a cassette
400 Soldering device
401 First treatment bath (entrance bath)
402 Second treatment bath (entrance bath)
403 Third treatment bath (high temperature treatment bath)
404 Fourth treatment bath 404 (soldering treatment bath)
405 Fifth treatment bath (solution removal treatment bath)
406 Sixth treatment bath (connecting bath)
407 Seventh treatment bath (exit bath)
411 Entrance stack
412 Introduction device
413 Arm
421 Exit stack
422 Exit device
423 Arm
431 Treatment tank
432 Arm rotating shaft
433 Cover
434 Pivoting arm
435 Suspension arm 435
436 Robotic arm
437 Gripping member
438 Sliding member
441 Solder circulation tank
443 Filter
443 Ear pump
500, 510, 520, 530, 540 Substrate to be treated or treated substrate
501 Sliding rack

The invention claimed is:
1. A soldering device, comprising:
a first treatment part in which a component, having an electrode to be soldered, is set;
a second treatment part that is separated in a sealable manner by a first opening-closing unit, which is provided between the first treatment part and the second treatment part, and that sends out the component, which is fed from the first treatment part;
a third treatment part that:
is separated in a sealable manner by a second opening-closing unit, which is provided between the second treatment part and the third treatment part;
causes the component, which is fed from the second treatment part, to make contact with an organic fatty acid-containing solution; and
moves the component horizontally;
a fourth treatment part that has:
a molten solder adhesion unit that moves the component, which has been moved horizontally by the third treatment part, to an upper space portion of the fourth treatment part and that causes a molten solder to be adhered onto the electrode; and a molten solder removal unit that removes excessive molten solder out of the molten solder adhered onto the electrode;

a fifth treatment part that moves the component horizontally, which has been moved downward from the upper space portion in the fourth treatment part;

a sixth treatment part that is separated in a sealable manner by a third opening-closing unit, which is provided between the fifth treatment part and the sixth treatment part, and that sends out the component, which is fed from the fifth treatment part; and a seventh treatment part that is separated in a sealable manner by a fourth opening-closing unit, which is provided between the sixth treatment part and the seventh treatment part, and that takes out the component, which is fed from the sixth treatment part, from the soldering device.

2. The soldering device according to claim 1, wherein the first opening-closing unit and the second opening-closing unit are controlled to prohibit opening at the same time and the third opening-closing unit and the fourth opening-closing unit are controlled to prohibit opening at the same time.

3. The soldering device according to claim 1, further comprising:

a first cassette conveying device that moves a first cassette between at least the second treatment part and the third treatment part, the component being loaded onto the first cassette; and a second cassette conveying device that moves a second cassette between at least the fifth treatment part and the sixth treatment part, the component being loaded onto the second cassette.

4. The soldering device according to claim 1, wherein the molten solder adhesion unit and the molten solder removal unit are operated while moving the component.

5. A soldering method, comprising:

a first treatment step in which a component, having an electrode to be soldered, is set in a first treatment part of a soldering device;

a second treatment step, wherein said second treatment step occurs in a second treatment part of the soldering device, said second treatment part being separated in a sealable manner by a first opening-closing unit, which is provided between the first treatment part and the second treatment part, and said second treatment step involves sending out the component, which is fed from the first treatment part, from the second treatment part;

a third treatment step, wherein said third treatment step occurs in a third treatment part of the soldering device, said third treatment part being separated in a sealable manner by a second opening-closing unit, which is provided between the second treatment part and the third treatment part, and said third treatment step involves contacting the component, which is fed from the second treatment part, with an organic fatty acid-containing solution and involves moving the component horizontally to a fourth treatment part of the soldering device;

a fourth treatment step, wherein said fourth treatment step occurs in the fourth treatment part, said fourth treatment part being comprised of a molten solder adhesion unit and a molten solder removal unit, and said fourth treatment step involves:

using the molten solder adhesion unit to move the component, which has been moved horizontally to the fourth treatment part in the third treatment step, to an upper space portion of the fourth treatment part and to adhere molten solder onto the electrode; and using the molten solder removal unit to remove excessive molten solder out of the molten solder adhered onto the electrode;

a fifth treatment step, wherein said fifth treatment step occurs in a fifth treatment part of the soldering device and said fifth treatment step involves moving the component, which is moved downward from the upper space portion of the fourth treatment part during the fourth treatment step, horizontally;

a sixth treatment step, wherein said sixth treatment step occurs in a sixth treatment part of the soldering device, said sixth treatment part being separated in a sealable manner by a third opening-closing unit, which is provided between the fifth treatment part and the sixth treatment part, and said sixth treatment step involves sending out the component, which is fed from the fifth treatment part, from the sixth treatment part; and a seventh treatment step, wherein said seventh treatment step occurs in a seventh treatment part of the soldering device, said seventh treatment part being separated in a sealable manner by a fourth opening-closing unit, which is provided between the sixth treatment part and the seventh treatment part, and said seventh treatment step involves taking out the component, which is fed from the sixth treatment part, from the soldering device.

* * * * *